(12) United States Patent
Kim

(10) Patent No.: US 12,107,088 B2
(45) Date of Patent: Oct. 1, 2024

(54) DISPLAY DEVICE

(71) Applicant: Samsung Display Co., Ltd., Yongin-si (KR)

(72) Inventor: Keunwoo Kim, Seongnam-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 241 days.

(21) Appl. No.: 17/455,188

(22) Filed: Nov. 16, 2021

(65) Prior Publication Data
US 2022/0285404 A1 Sep. 8, 2022

(30) Foreign Application Priority Data
Mar. 5, 2021 (KR) .................. 10-2021-0029740

(51) Int. Cl.
*H01L 27/14* (2006.01)
*H01L 27/12* (2006.01)

(52) U.S. Cl.
CPC ........ *H01L 27/1218* (2013.01); *H01L 27/124* (2013.01); *H01L 27/1255* (2013.01)

(58) Field of Classification Search
CPC .............. H01L 27/1218; H01L 27/124; H01L 27/1255; H01L 29/78648; H01L 29/78633; H01L 27/156; H10K 59/12; H10K 59/1213; H10K 59/1216; H10K 59/121; H10K 59/40; H10K 59/60; H10K 59/126; H10K 77/111; H10K 2102/311
USPC .................................................. 257/59, 72
See application file for complete search history.

(56) References Cited

U.S. PATENT DOCUMENTS

| | | | |
|---|---|---|---|
| 9,704,868 B2* | 7/2017 | Miyairi | ............ H01L 29/78654 |
| 10,916,613 B1* | 2/2021 | Xu | ........................ H10K 59/124 |
| 11,158,261 B2 | 10/2021 | Kim et al. | |
| 11,574,978 B2* | 2/2023 | Li | ........................ G09G 3/3233 |
| 2015/0349127 A1 | 12/2015 | Kurata et al. | |
| 2016/0104754 A1 | 4/2016 | You | |
| 2017/0011685 A1 | 1/2017 | Jeon | |
| 2018/0197474 A1 | 7/2018 | Jeon et al. | |
| 2022/0115409 A1* | 4/2022 | Kurata | ..................... H01L 21/84 |

FOREIGN PATENT DOCUMENTS

| | | |
|---|---|---|
| CN | 112397021 A | 2/2021 |
| KR | 10-2017-0006335 A | 1/2017 |
| KR | 10-2018-0012442 A | 2/2018 |
| KR | 10-2018-0081655 A | 7/2018 |
| KR | 10-2020-0052782 A | 5/2020 |
| KR | 10-2020-0080890 A | 7/2020 |
| KR | 10-2020-0087368 A | 7/2020 |
| KR | 10-2021-0019639 A | 2/2021 |

* cited by examiner

*Primary Examiner* — Tan N Tran
(74) *Attorney, Agent, or Firm* — Lewis Roca Rothgerber Christie LLP

(57) ABSTRACT

A display device includes a substrate including a polymer film, a first active pattern above the substrate, and including a first channel region, a gate electrode above the first active pattern, and overlapping the first channel region, a first storage capacitor electrode above the gate electrode, and overlapping the gate electrode, a second active pattern at a layer above the first storage capacitor electrode, and including a second channel region, a first gate line above the second active pattern, and overlapping the second channel region, and a blocking pattern between the first channel region and the first gate line in a plan view.

19 Claims, 18 Drawing Sheets

DISPLAY DEVICE

CROSS-REFERENCE TO RELATED APPLICATION

This application claims priority to, and the benefit of, Korean Patent Application No. 10-2021-0029740, filed on Mar. 5, 2021 in the Korean Intellectual Property Office (KIPO), the contents of which are herein incorporated by reference in their entirety.

BACKGROUND

1. Field

Embodiments relate to a display device.

2. Discussion of the Related Art

Recently, a polymer substrate has been used to reduce a weight of a display device and to diversify designs. The polymer substrate includes a polymer such as polyimide.

When the display device includes the polymer substrate, dipole polarization may occur due to an electric signal applied to a driving element, etc.

SUMMARY

Embodiments provide a display device with improved display quality.

A display device according to some embodiments may include a substrate including a polymer film, a first active pattern above the substrate, and including a first channel region, a gate electrode above the first active pattern, and overlapping the first channel region, a first storage capacitor electrode above the gate electrode, and overlapping the gate electrode, a second active pattern at a layer above the first storage capacitor electrode, and including a second channel region, a first gate line above the second active pattern, and overlapping the second channel region, and a blocking pattern between the first channel region and the first gate line in a plan view.

The blocking pattern might not overlap the second channel region.

The blocking pattern may be at a same layer as the first storage capacitor electrode, and spaced apart from the first storage capacitor electrode in a plan view.

A length of the blocking pattern in a first direction may be greater than a length of the first channel region in the first direction.

The display device may further include a second gate line at a same layer as the first storage capacitor electrode, overlapping the first gate line, and spaced apart from the blocking pattern in a plan view.

The blocking pattern may be between the second gate line and the first storage capacitor electrode in a plan view.

The polymer film may include a polyimide.

The display device may further include a cover panel under the substrate and defining at least one opening, wherein the substrate includes a sensing area, and a display area surrounding the sensing area, and wherein the blocking pattern is in the sensing area.

The blocking pattern may overlap the gate electrode.

The gate electrode and the first storage capacitor electrode may compose a first storage capacitor, wherein the gate electrode and the blocking pattern compose a second storage capacitor.

The display device may further include a high power voltage line above the first gate line, connected to the blocking pattern, and connected to the first storage capacitor electrode.

The display device may further include a second storage capacitor electrode at a same layer as the gate electrode, and spaced apart from the gate electrode in a plan view.

The blocking pattern may overlap the second storage capacitor electrode.

The gate electrode and the first storage capacitor electrode may compose a first storage capacitor, wherein the second storage capacitor electrode and the blocking pattern compose a second storage capacitor.

A display device according to some embodiments may include a substrate including a polymer film, a first active pattern above the substrate, and including a first channel region, a gate electrode above the first active pattern, overlapping the first channel region, and composing a driving transistor with the first active pattern, a first storage capacitor electrode above the gate electrode, and overlapping the gate electrode, a second active pattern at a layer above the first storage capacitor electrode, and including a second channel region, a first gate line above the second active pattern, overlapping the second channel region, and composing a compensation transistor with the second active pattern, and a blocking pattern between the driving transistor and the compensation transistor in a plan view.

The blocking pattern may be at a same layer as the first storage capacitor electrode, and spaced apart from the first storage capacitor electrode in a plain view.

The blocking pattern may overlap the gate electrode.

The display device may further include a second storage capacitor electrode at a same layer as the gate electrode, and spaced apart from the gate electrode.

The blocking pattern may overlap the second storage capacitor electrode.

In a display device according to embodiments of the present disclosure, the blocking pattern may prevent or reduce a change of element characteristics of a transistor by changing or blocking an electric field provided to the transistor. Accordingly, a reliability of the display device may improve. Also, because a mask process to form the blocking pattern is not added, a manufacturing cost and manufacturing time may be relatively reduced.

DETAILED DESCRIPTION

Figure 1:
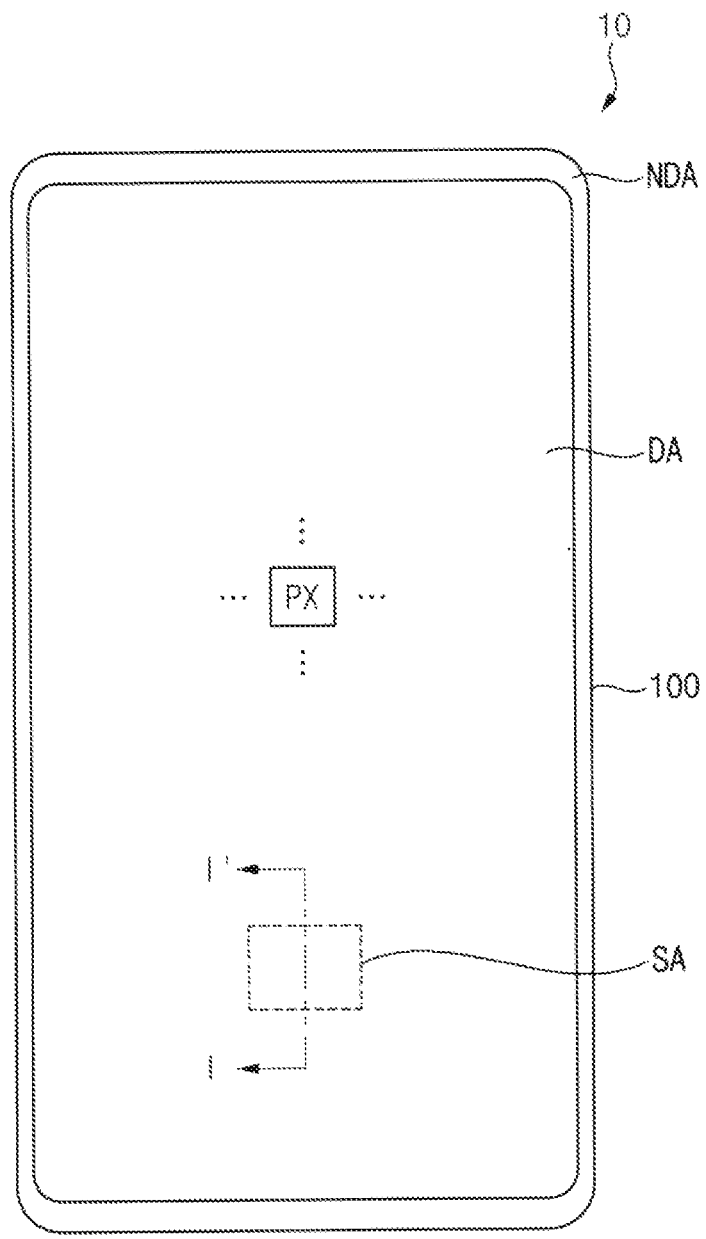
FIG. 1 is a plan view illustrating a display device according to some embodiments.

Aspects of some embodiments of the present disclosure and methods of accomplishing the same may be understood more readily by reference to the detailed description of embodiments and the accompanying drawings. Hereinafter, embodiments will be described in more detail with reference to the accompanying drawings. The described embodiments, however, may have various modifications and may be embodied in various different forms, and should not be construed as being limited to only the illustrated embodiments herein. Rather, these embodiments are provided as examples so that this disclosure will be thorough and complete, and will fully convey the aspects of the present disclosure to those skilled in the art, and it should be understood that the present disclosure covers all the modifications, equivalents, and replacements within the idea and technical scope of the present disclosure. Accordingly, processes, elements, and techniques that are not necessary to those having ordinary skill in the art for a complete understanding of the aspects of the present disclosure may not be described.

Unless otherwise noted, like reference numerals, characters, or combinations thereof denote like elements throughout the attached drawings and the written description, and thus, descriptions thereof will not be repeated. Further, parts that are not related to, or that are irrelevant to, the description of the embodiments might not be shown to make the description clear.

In the drawings, the relative sizes of elements, layers, and regions may be exaggerated for clarity. Additionally, the use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified.

Various embodiments are described herein with reference to sectional illustrations that are schematic illustrations of embodiments and/or intermediate structures. As such, variations from the shapes of the illustrations as a result, for example, of manufacturing techniques and/or tolerances, are to be expected. Further, specific structural or functional descriptions disclosed herein are merely illustrative for the purpose of describing embodiments according to the concept of the present disclosure. Thus, embodiments disclosed herein should not be construed as limited to the particular illustrated shapes of regions, but are to include deviations in shapes that result from, for instance, manufacturing.

For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the drawings are schematic in nature and their shapes are not intended to illustrate the actual shape of a region of a device and are not intended to be limiting. Additionally, as those skilled in the art would realize, the described embodiments may be modified in various different ways, all without departing from the spirit or scope of the present disclosure.

In the detailed description, for the purposes of explanation, numerous specific details are set forth to provide a thorough understanding of various embodiments. It is apparent, however, that various embodiments may be practiced without these specific details or with one or more equivalent arrangements. In other instances, well-known structures and devices are shown in block diagram form in order to avoid unnecessarily obscuring various embodiments.

Spatially relative terms, such as "beneath," "below," "lower," "under," "above," "upper," and the like, may be used herein for ease of explanation to describe one element or feature's relationship to another element(s) or feature(s) as illustrated in the figures. It will be understood that the spatially relative terms are intended to encompass different orientations of the device in use or in operation, in addition to the orientation depicted in the figures. For example, if the device in the figures is turned over, elements described as "below" or "beneath" or "under" other elements or features would then be oriented "above" the other elements or features. Thus, the example terms "below" and "under" can encompass both an orientation of above and below. The device may be otherwise oriented (e.g., rotated 90 degrees or at other orientations) and the spatially relative descriptors used herein should be interpreted accordingly. Similarly, when a first part is described as being arranged "on" a second part, this indicates that the first part is arranged at an upper side or a lower side of the second part without the limitation to the upper side thereof on the basis of the gravity direction.

Further, in this specification, the phrase "on a plane," or "plan view," means viewing a target portion from the top, and the phrase "on a cross-section" means viewing a cross-section formed by vertically cutting a target portion from the side.

It will be understood that when an element, layer, region, or component is referred to as being "formed on," "on," "connected to," or "coupled to" another element, layer, region, or component, it can be directly formed on, on, connected to, or coupled to the other element, layer, region, or component, or indirectly formed on, on, connected to, or coupled to the other element, layer, region, or component such that one or more intervening elements, layers, regions, or components may be present.

In addition, this may collectively mean a direct or indirect coupling or connection and an integral or non-integral coupling or connection. For example, when a layer, region, or component is referred to as being "electrically connected" or "electrically coupled" to another layer, region, or component, it can be directly electrically connected or coupled to the other layer, region, and/or component or intervening layers, regions, or components may be present. However, "directly connected/directly coupled," or "directly on," refers to one component directly connecting or coupling another component, or being on another component, without an intermediate component. Meanwhile, other expressions describing relationships between components such as "between," "immediately between" or "adjacent to" and "directly adjacent to" may be construed similarly. In addition, it will also be understood that when an element or layer is referred to as being "between" two elements or layers, it can be the only element or layer between the two elements or layers, or one or more intervening elements or layers may also be present.

It will be understood that, although the terms "first," "second," "third," etc., may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section described below could be termed a second element, component, region, layer or section, without departing from the spirit and scope of the present disclosure. The description of an element as a "first" element may not require or imply the presence of a second element or other elements. The terms "first", "second", etc. may also be used herein to differentiate different categories or sets of elements. For conciseness, the terms "first", "second", etc. may represent "first-category (or first-set)", "second-category (or second-set)", etc., respectively.

In the examples, the x-axis, the y-axis, and/or the z-axis are not limited to three axes of a rectangular coordinate system, and may be interpreted in a broader sense. For example, the x-axis, the y-axis, and the z-axis may be perpendicular to one another, or may represent different directions that are not perpendicular to one another. The same applies for first, second, and/or third directions.

The terminology used herein is for the purpose of describing particular embodiments only and is not intended to be limiting of the present disclosure. As used herein, the singular forms "a" and "an" are intended to include the plural forms as well, unless the context clearly indicates otherwise. It will be further understood that the terms "comprises," "comprising," "have," "having," "includes," and "including," when used in this specification, specify the presence of the stated features, integers, steps, operations, elements, and/or components, but do not preclude the presence or addition of one or more other features, integers, steps, operations, elements, components, and/or groups thereof.

As used herein, the term "substantially," "about," "approximately," and similar terms are used as terms of approximation and not as terms of degree, and are intended to account for the inherent deviations in measured or calculated values that would be recognized by those of ordinary skill in the art. "About" or "approximately," as used herein, is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 10%, 5% of the stated value. Further, the use of "may" when describing embodiments of the present disclosure refers to "one or more embodiments of the present disclosure."

Unless otherwise defined, all terms (including technical and scientific terms) used herein have the same meaning as commonly understood by one of ordinary skill in the art to which the present disclosure belongs. It will be further understood that terms, such as those defined in commonly used dictionaries, should be interpreted as having a meaning that is consistent with their meaning in the context of the relevant art and/or the present specification, and should not be interpreted in an idealized or overly formal sense, unless expressly so defined herein.

FIG. 1 is a plan view illustrating a display device according to some embodiments.

Referring to FIG. 1, a display device 10 may include a display area DA and a non-display area NDA. The display area DA may be an area that displays an image. A planar shape of the display area DA may be a rectangular shape, or as illustrated in FIG. 1, may be a rectangular shape with rounded corners. However the planar shape of the display area DA is not limited thereto, and the display area DA may have various planar shapes such as a circular shape, an oval shape, a polygonal shape, etc.

The display area DA may include a sensing area SA located in the display area DA. The sensing area SA may recognize various information from the user of the display device 10. In some embodiments, the sensing area SA may recognize a fingerprint of the user. Also, the sensing area SA may recognize an infrared light.

As illustrated in FIG. 1, a planar shape of the sensing area SA may be a rectangular shape. However, the planar shape of the sensing area SA is not limited thereto, the sensing area SA may have various planar shapes, such as a circular shape, an oval shape, a polygonal shape, etc.

The non-display area NDA may be located around the display area DA. The non-display area NDA may surround the display area DA. The non-display area NDA may be an area that does not display an image. In some embodiments, driving units for displaying the image of the display area DA may be located in the non-display area NDA.

Figure 2:
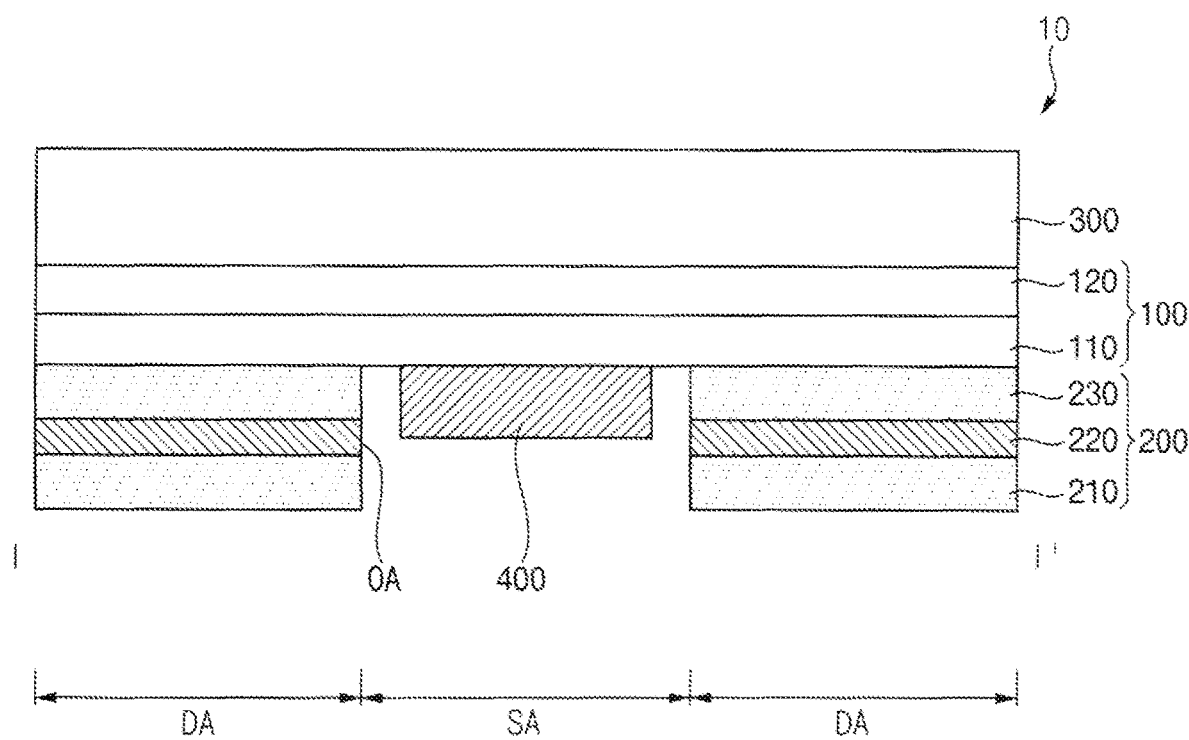
FIG. 2 is a cross-sectional view of the display device taken along the line I-I' of FIG. 1.

FIG. 2 is a cross-sectional view of the display device taken along the line I-I' of FIG. 1.

Referring to FIGS. 1 and 2, the display device 10 may include a display panel 100, a cover panel 200, a window 300, and a sensor 400.

The display panel 100 may display an image. The display panel 100 may include a circuit element layer 110 and a display element layer 120.

The circuit element layer 110 may include a substrate (e.g., a substrate SUB of FIG. 11), and circuit elements located on the substrate. For example, the circuit elements may be a transistor, a capacitor, a wiring, etc.

The display element layer 120 may be located on the circuit element layer 110. The display element layer 120 may include display elements. For example, each of the display elements may be an organic light emitting diode.

The window 300 may be located on the display panel 100. The window 300 may protect the display panel 100, and may transmit light emitted from the display panel 100. Accordingly, the display device 10 may provide an image that is displayed by the display panel 100 through the window 300. The window 300 may include glass or plastic such as polyethylene terephthalate, polyvinyl resin, polyester, polyimide, etc.

The window 300 may be located to overlap the display panel 100, and to cover a front surface of the display panel 100. The window 300 may include a black matrix located along an edge of a lower surface of the window 300. The black matrix may reduce or prevent visibility of components located under the window 300 through a front surface (or, display surface) of the display device 10.

An input sensing layer and an anti-reflection layer may be located between the display panel 100 and the window 300. The input sensing layer may sense an external input, such as an external object contacting with or approaching the display device 10. The input sensing layer may be located on an entirety of a surface of the display panel 100. The anti-reflection layer may reduce a reflection of external light entering the display panel 100 through the window 300. In some embodiments, the anti-reflection layer may include a polarizer. The input sensing layer and the anti-reflection layer may be coupled by an optically clear adhesive (OCA), an optically clear resin (OCR), etc.

The cover panel 200 may be located under the display panel 100. The cover panel 200 may absorb an impact to the display panel, or may block light that may enter the display panel 100, or may absorb heat that is emitted from the display panel 100.

The cover panel 200 may include a heat dissipation layer 210, a cushion layer 220, and an embossing layer 230.

The cushion layer 220 may located on a lower surface of the display panel 100 to relieve the impact of the display panel 100. The cushion layer 220 may include a polymer resin such as polypropylene (PP), polyethylene (PE), etc. The embossing layer 230 may be located between the cushion layer 220 and the display panel 100. The embossing layer 230 may have an adhesive function. The heat dissipation layer 210 may be located under the cushion layer 220. The heat dissipation layer 210 may include graphite and copper (Cu). The heat dissipation layer 210 may have a multilayer structure that is formed of a layer including graphite and copper. The heat dissipation layer 210 may dissipate heat, and may emit heat that is transmitted from the display panel 100 to the outside.

The cover panel 200 may include at least one opening OA. The opening OA may overlap the sensing area SA. When there are two or more sensing areas SA, there may also be two or more openings OA. Accordingly, the opening OA may be located in the display area DA in a plan view. Light may enter through the opening OA.

The sensor 400 may be located in the opening OA under the display panel 100. In some embodiments, the sensor 400 may be a fingerprint recognition sensor using infrared or ultrasonic waves. However, the present disclosure is not limited thereto, and in other embodiments, the sensor 400 may be an iris recognition sensor or a proximity sensor using infrared or ultrasonic waves.

In some embodiments, a blocking pattern (e.g., the blocking pattern FSL of FIG. 6) to be described later may be located in each of pixels PX located in the sensing area SA of the display area DA of the display device 10. Because the blocking pattern is located on each of the pixels PX located in the sensing area SA, even if light enters through the opening OA that overlaps the sensing area SA, change of a characteristic of a first transistor that is driving transistor may be reduced or prevented. The blocking pattern may be located in each of all the pixels PX located in the display area DA of the display device 10, but may be located only in each of the pixels PX located in the sensing area SA of the display device 10. When the blocking pattern is located only in the sensing area SA, process cost and time may be reduced. The blocking pattern may be described later in detail with reference to FIGS. 4 to 11.

Figure 3:
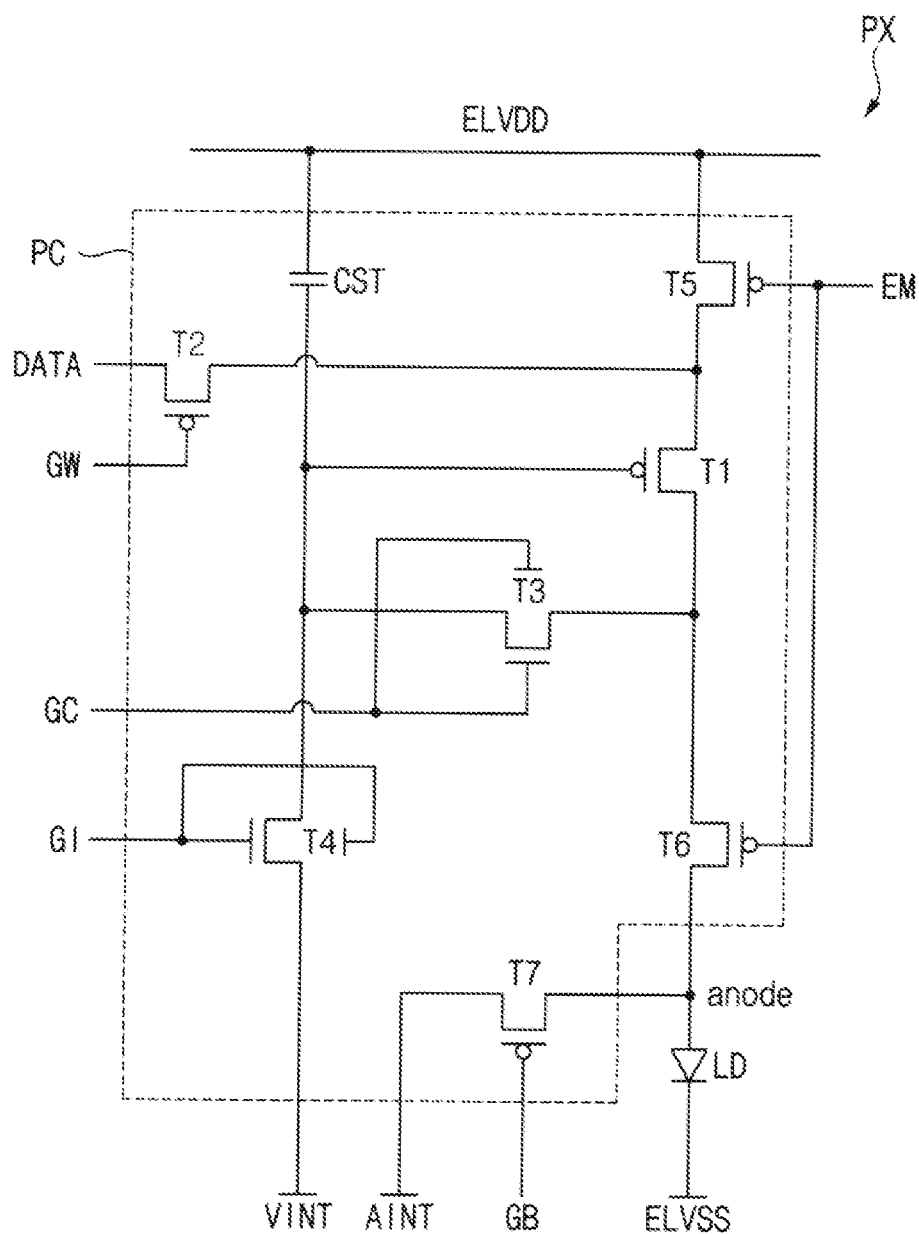
FIG. 3 is a circuit diagram illustrating an example of one pixel included in the display device of FIG. 1.

FIG. 3 is a circuit diagram illustrating an example of one pixel included in the display device of FIG. 1.

Referring to FIGS. 1 and 3, the display device 10 may include the plurality of the pixels PX. Each of the plurality of the pixels PX may include a pixel circuit PC and a light emitting diode LD. The pixel circuit PC may include a first transistor T1, a second transistor T2, a third transistor T3, a fourth transistor T4, a fifth transistor T5, a sixth transistor T6, a seventh transistor T7, and a storage capacitor CST. The pixel circuit may be electrically connected to the light emitting diode LD, and may provide a driving current to the light emitting diode LD.

The light emitting diode LD may include a first terminal (e.g., an anode terminal) and a second terminal (e.g., a cathode terminal). The first terminal of the light emitting diode LD may be connected to the first transistor T1 via the sixth transistor T6, and may receive the driving current. The second terminal of the light emitting diode LD may receive a low power voltage ELVSS. The light emitting diode LD may generate light having a luminance corresponding to the driving current.

The storage capacitor CST may include a first terminal and a second terminal. The first terminal of the storage capacitor CST may be connected to the first transistor T1, and the second terminal of the storage capacitor CST may receive a high power voltage ELVDD.

The first transistor T1 may include a gate terminal, a first terminal (e.g., a source terminal) and a second terminal (e.g., a drain terminal). The gate terminal of the first transistor T1 may be connected to the first terminal of the storage capacitor CST. The first terminal of the first transistor may be connected to the second transistor T2, and may receive a data voltage DATA. The second terminal of the first transistor T1 may provide the driving current to the light emitting diode LD. The first transistor T1 may generate the driving current based on a voltage difference between the gate terminal and the first terminal thereof. For example, the first transistor T1 may be referred to as a driving transistor.

The second transistor T2 may include a gate terminal, a first terminal (e.g., a source terminal), and a second terminal (e.g., a drain terminal). The gate terminal of the second transistor T2 may receive a write gate signal GW. The first terminal of the second transistor T2 may receive the data voltage DATA. The second terminal of the second transistor T2 may provide the data voltage DATA to the first terminal of the first transistor T1 while the second transistor T2 is turned on.

The second transistor T2 may be turned on or off in response to the write gate signal GW. For example, when the second transistor T2 is a PMOS transistor, the second transistor T2 may be turned off when the write gate signal GW has a positive voltage level, and may be turned on when the write gate signal GW has a negative voltage level. For example, the second transistor T2 may be referred to as a switching transistor.

The third transistor T3 may include a gate terminal, a back-gate terminal, a first terminal (e.g., a source terminal), and a second terminal (e.g., a drain terminal). The gate terminal and the back-gate terminal of the third transistor T3 may receive a compensation control signal GC. As the third transistor T3 has a dual-gate structure, reliability of the third transistor T3 may be improved. The first terminal of the third transistor T3 may be connected to the second terminal of the first transistor T1. The second terminal of the third transistor T3 may be connected to the gate terminal of the first transistor T1.

The third transistor T3 may be turned on or off in response to the compensation control signal GC. For example, when the third transistor T3 is a NMOS transistor, the third transistor T3 may be turned on when the compensation control signal GC has a positive voltage level, and may be turned off when the compensation control signal GC has a negative voltage level. The third transistor T3 may compensate for a threshold voltage of the first transistor T1. For example, the third transistor T3 may be referred to as a compensation transistor.

The fourth transistor T4 may include a gate terminal, a back-gate terminal, a first terminal (e.g., a source terminal), and a second terminal (e.g., a drain terminal). The gate terminal and the back-gate terminal of the fourth transistor T4 may receive an initialization gate signal GI. As the fourth transistor T4 has a dual-gate structure, reliability of the fourth transistor T4 may be improved. The first terminal of the fourth transistor T4 may receive an initialization voltage VINT. The second terminal of the fourth transistor T4 may be connected to the gate terminal of the first transistor T1.

The fourth transistor T4 may be turned on or off in response to the initialization gate signal GI. For example, when the fourth transistor T4 is a NMOS transistor, the fourth transistor T4 may be turned on when the initialization gate signal GI has a positive voltage level, and may be turned off when the initialization gate signal GI has a negative voltage level. The fourth transistor T4 may initialize the gate terminal of the first transistor T1 to the initialization voltage VINT. For example, the fourth transistor T4 may be referred to as an initialization transistor.

The fifth transistor T5 may include a gate terminal, a first terminal (e.g., a source terminal), and a second terminal (e.g., a drain terminal). The gate terminal of the fifth transistor T5 may receive an emission control signal EM. The first terminal of the fifth transistor T5 may receive the high power voltage ELVDD. The second terminal of the fifth transistor T5 may be connected to the first terminal of the first transistor T1. When the fifth transistor T5 is turned on in response to the emission control signal EM, the fifth transistor T5 may provide the high power voltage ELVDD to the first transistor T1.

The sixth transistor T6 may include a gate terminal, a first terminal (e.g., a source terminal), and a second terminal (e.g., a drain terminal). The gate terminal of the sixth transistor T6 may receive the emission control signal EM. The first terminal of the sixth transistor T6 may be connected to the second terminal of the first transistor T1. The second terminal of the sixth transistor T6 may be connected to the first terminal of the light emitting diode LD. When the sixth transistor T6 is turned on in response to the emission control signal EM, the sixth transistor T6 may provide the driving current that is generated by the first transistor T1 to the light emitting diode LD.

The seventh transistor T7 may include a gate terminal, a first terminal (e.g., a source terminal), and a second terminal (e.g., a drain terminal). The gate terminal of the seventh transistor T7 may receive a bypass gate signal GB. The first terminal of the seventh transistor T7 may receive an anode initialization voltage AINT. The second terminal of the seventh transistor T7 may be connected to the first terminal of the light emitting diode LD. When the seventh transistor T7 is turned on in response to the bypass gate signal GB, the seventh transistor T7 may provide the anode initialization voltage AINT to the light emitting diode LD. Accordingly, the seventh transistor T7 may initialize the first terminal of the light emitting diode LD to the anode initialization voltage AINT. For example, the seventh transistor T7 may be referred to as an anode initialization transistor.

Meanwhile, a connection structure of the pixel circuit PC and the light emitting diode LD illustrated in FIG. 3 are merely an example, and may be variously changed.

Figure 11:
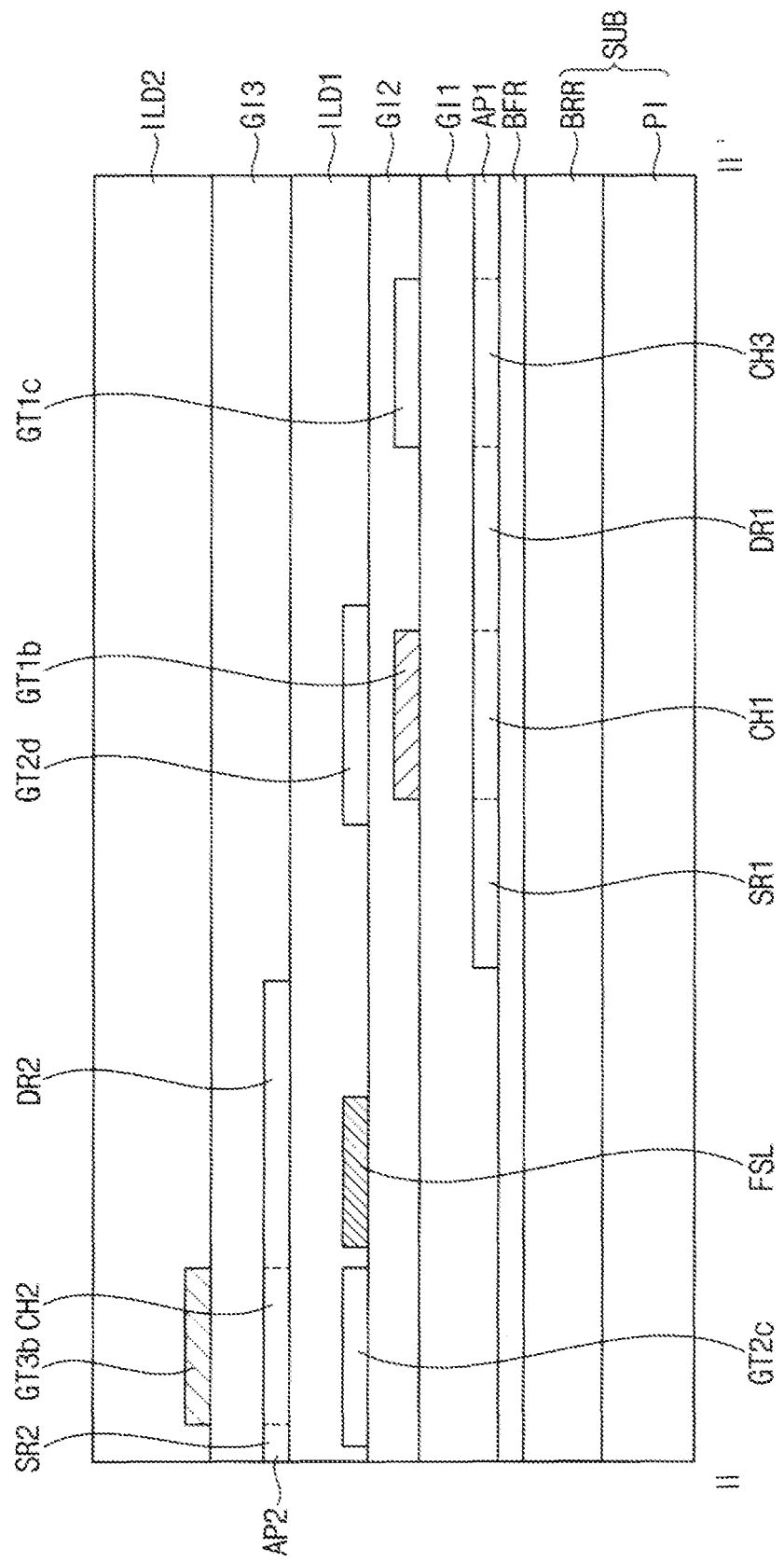
FIG. 11 is a cross-sectional view of the display device taken along the line II-II' of FIG. 8.

FIGS. 4 to 10 are layout views for explaining pixels included in a display device according to some embodiments. FIG. 11 is a cross-sectional view of the display device taken along the line II-ll' of FIG. 8.

Figure 4:
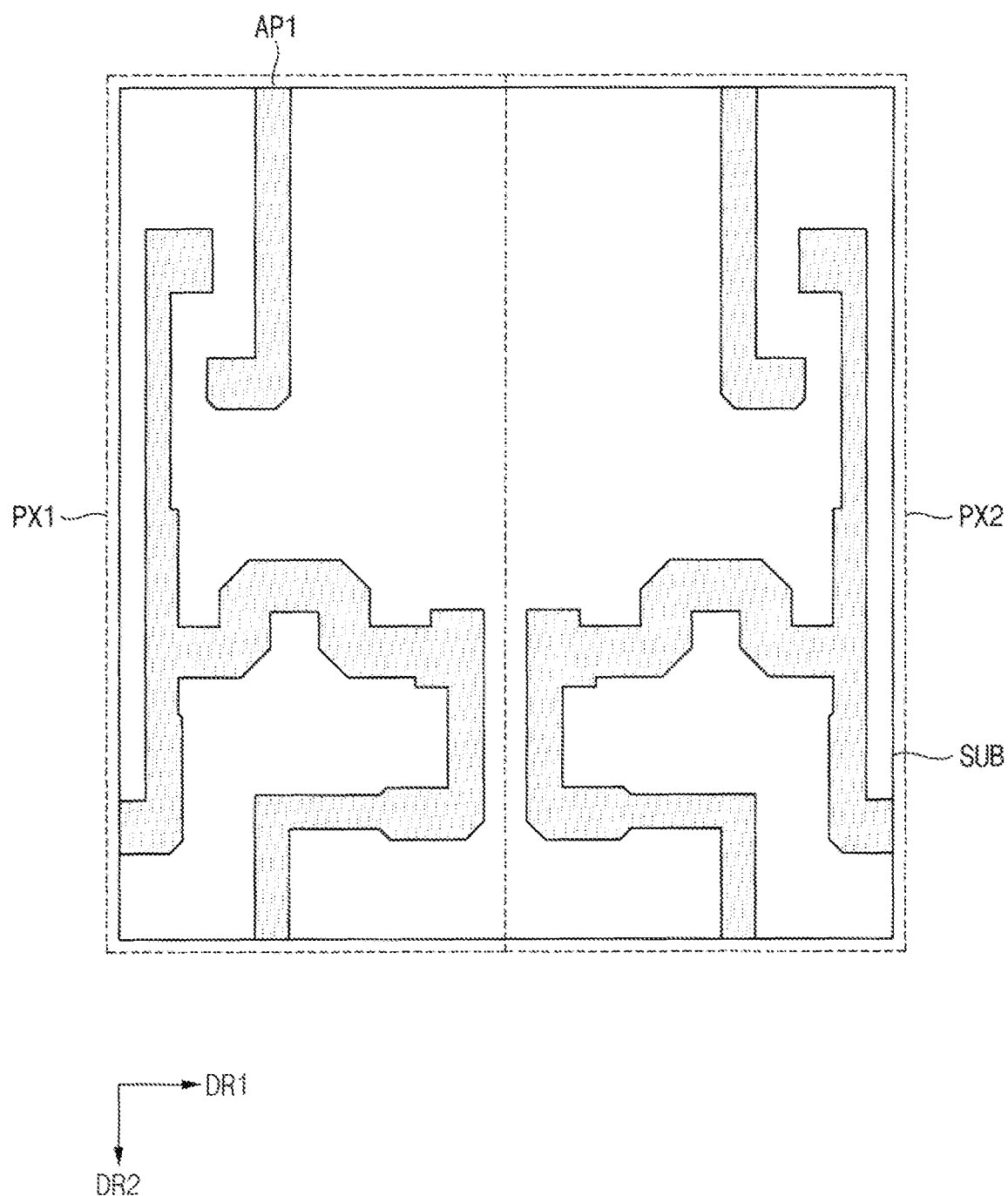
FIGS. 4 to 10 are layout views for explaining pixels included in a display device according to some embodiments.
Figure 5:
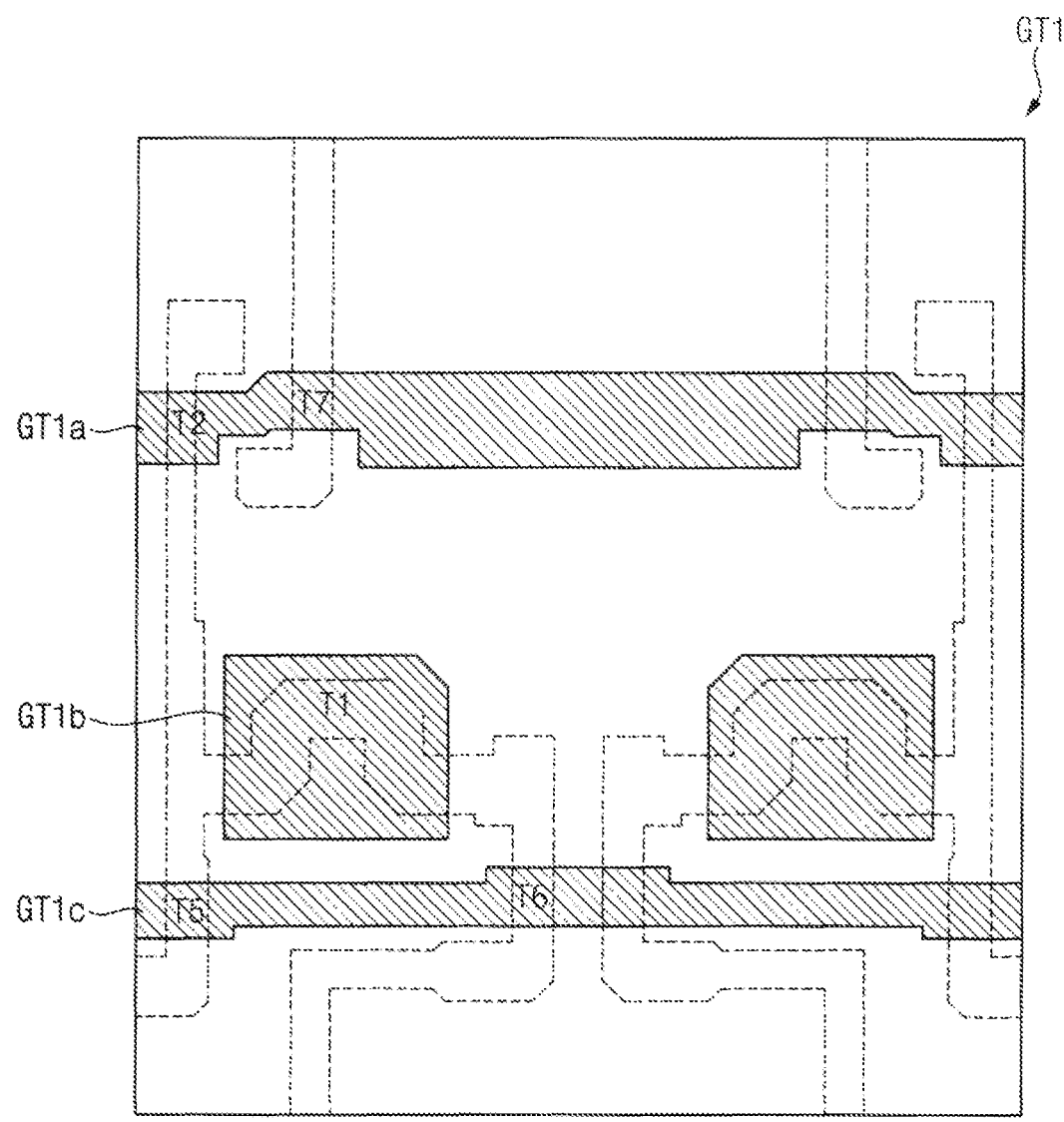

Referring to FIGS. 3, 4, and 11, the display device 10 may include a first pixel PX1 and a second pixel PX2 adjacent to each other. For example, the second pixel PX2 may be located in the first direction DR1 from the first pixel PX1. The second pixel PX2 may have a structure in which the structure of the first pixel PX1 is symmetrical based on a virtual symmetric line along a second direction DR2 that is substantially perpendicular to the first direction DR1.

The substrate SUB may include glass, quartz, plastic, etc. In some embodiments, the substrate SUB may include plastic, and thus the display device 10 may have a flexible characteristic.

The substrate SUB may have a structure in which at least one polymer film PI and at least one barrier layer BRR are alternately stacked. For example, the polymer film PI may be formed using an organic material such as polyimide, and the barrier layer BRR may be formed using an inorganic material.

In some embodiments, the polymer film PI may include polyimide. For example, the polymer film (PI) may include polyethylene terephthalate, polyethylene naphthalate, polyether ketone, polycarbonate, polyarylate, polyethersulfone, polyimide, polybenzoxazole, polybenzobisoxazole, polybenzoimi dazole, polybenzothiazole, and/or a mixture thereof.

The barrier layer BRR may reduce or prevent diffusion of metal atoms or impurities from the substrate SUB to the first active pattern AP1. The barrier layer BRR may include silicon oxide, silicon nitride, silicon oxynitride, aluminum oxide, tantalum oxide, hafnium oxide, zirconium oxide, titanium oxide, and/or a mixture thereof. For example, the barrier layer BRR may include silicon oxide.

The buffer layer BFR may be located on the substrate SUB. The buffer layer BFR may reduce or prevent diffusion of metal atoms or impurities from the substrate SUB to the first active pattern AP1. The buffer layer BFR may include silicon oxide, silicon nitride, and/or silicon oxynitride, and may have a single-layer or multi-layer structure.

The first active pattern AP1 may be located on the buffer layer BFR. In some embodiments, the first active pattern AP1 may include a silicon semiconductor.

For example, the silicon semiconductor may include amorphous silicon, polycrystalline silicon, etc. For example, the first active pattern AP1 may include the polycrystalline silicon formed by crystallizing the amorphous silicon.

The first active pattern AP1 may include a channel region, a source region, and a drain region. For example, the first active pattern AP1 may include a first channel region CH1, a first source region SR1 contacting the first channel region CH1, and a first drain region DR1 contacting the first channel region CH1. The first source region SR1 and the first drain region DR1 may serve as a source electrode and a drain electrode, respectively.

The first gate insulation layer GI1 may cover the first active pattern AP1 and may be located on the substrate SUB. The first gate insulation layer GI1 may include an insulating material. For example, the first gate insulation layer GI1 may include silicon oxide, silicon nitride, silicon oxynitride, aluminum oxide, etc.

Referring FIGS. 3, 4, 5 and 11, the first gate layer GT1 may be located on the first gate insulation layer GI1. The first gate layer GT1 may include a write gate line GT1a, a gate electrode GT1b, and an emission control line GT1c.

The write gate line GT1a may extend in the first direction DR1. The write gate line GT1a may compose the second transistor T2 with the first active pattern AP1.

For example, the write gate line GT1a may receive the write gate signal GW. Also, the write gate line GT1a may compose the seventh transistor T7 with the first active pattern API. For example, the write gate line GT1a may receive the bypass gate signal GB. The write gate signal GW and the bypass gate signal GB may have substantially the same waveform with a time difference.

The gate electrode GT1*b* may be located in an island shape. The gate electrode GT1*b* may compose the first transistor T1 with the first active pattern AP1.

The emission control line GT1*c* may extend in the first direction DR1. The emission control line GT1*c* may compose the fifth and sixth transistors T5 and T6 with the first active pattern API. For example, the emission control line GT1*c* may receive the emission control signal EM. The emission control line GT1*c* may be referred to as an emission control line.

For example, the first gate layer GT1 may include a metal, an alloy, a conductive metal oxide, a transparent conductive material, etc. For example, the first gate layer GT1 may include a metal such as molybdenum (Mo), aluminum (Al), copper (Cu), and/or titanium (Ti).

The second gate insulation layer GI2 may cover the first gate layer GT1 and may be located on the first gate insulation layer GI1. The second gate insulation layer GI2 may include an insulating material. For example, the second gate insulation layer GI2 may include silicon oxide, silicon nitride, and/or silicon oxynitride, and may have a single-layer or multi-layer structure.

Referring to FIGS. 3, 4, 5, 6, and 11, the second gate layer GT2 may be located on the second gate insulation layer GI2. The second gate layer GT2 may include a voltage line GT2*a*, a lower initialization gate line GT2*b*, a lower compensation gate line GT2*c* (e.g., a second gate line), a first storage capacitor electrode GT2*d*, and a blocking pattern FSL.

The lower initialization gate line GT2*b* may extend in the first direction DR1. For example, the lower initialization gate line GT2*b* may be spaced apart from the write gate line GT1*a* in a plan view. The lower initialization gate line GT2*b* may receive the initialization gate signal GI.

The lower compensation gate line GT2*c* may extend in the first direction DR1. The lower compensation gate line GT2*c* may receive compensation control signal GC, which is the second gate signal GC.

The first storage capacitor electrode GT2*d* may overlap the gate electrode GT1*b*. For example, the first storage capacitor electrode GT2*d* may compose the storage capacitor CST with the gate electrode GT1*b*. The first storage capacitor electrode GT2*d* may receive the high power voltage ELVDD. Also, a hole passing through the first storage capacitor electrode GT2*d* may be formed in the first storage capacitor electrode GT2*d*, and the hole may expose the gate electrode GT1*b*.

The voltage line GT2*a* may extend in the first direction DR1. In some embodiments, the voltage line GT2*a* may receive the initialization voltage VINT.

The blocking pattern FSL may have an elongated shape in the first direction DR1. The blocking pattern FSL may be located between the first storage capacitor electrode GT2*d* and the lower compensation gate line GT2*c* in a plan view.

The second gate layer GT2 may include a metal, an alloy, a conductive metal oxide, a transparent conductive material, etc. For example, the second gate layer GT2 may include a metal such as molybdenum (Mo), aluminum (Al), copper (Cu), and/or titanium (Ti).

The first interlayer insulation layer ILD1 may cover the second gate layer GT2 and may be located on the second gate insulation layer GI2. The first interlayer insulation layer ILD1 may include an insulating material. For example, the first interlayer insulation layer ILD1 may include silicon oxide, silicon nitride, silicon oxynitride, aluminum oxide, etc.

Referring to FIGS. 3, 4, 5, 6, 7, and 11, the second active pattern AP2 may be located on the first interlayer insulation layer ILD1. The second active pattern AP2 may include an oxide semiconductor. The first active pattern AP1 and the second active pattern AP2 may include different materials.

For example, the second active pattern AP2 may include indium (In), zinc (Zn), gallium (Ga), tin (Sn), titanium (Ti), aluminum (Al), hafnium (Hf), zirconium (Zr), a binary compound (ABx), a ternary compound (ABxCy), a quaternary compound (ABxCyDz) that include magnesium (Mg), etc. The second active pattern AP2 may include indium-gallium-zinc oxide.

The second active pattern AP2 may be located on a layer that is different from the first active pattern AP1, and might not overlap the first active pattern AP1. That is, the second active pattern AP2 may be spaced apart from the first active pattern AP1 in a plan view. In other words, the second active pattern AP2 may be formed separately from the first active pattern AP1.

The second active pattern AP2 may have a symmetrical shape with respect to an imaginary line extending in the second direction DR2. The second active pattern AP2 may include a portion located in the first pixel PX1 and a portion located in the second pixel PX2.

The second active pattern AP2 may overlap the write gate line GT1*a*, the lower initialization gate line GT2*b*, the lower compensation gate line GT2*c*, and the voltage line GT2*a*.

The second active pattern AP2 may include a channel region, a source region, and a drain region. For example, the second active pattern AP2 may include a second channel region CH2, a second source region SR2 that contacts with the second channel region CH2, and a second drain region DR2 that contacts with the second channel region CH2. The second source region SR2 and the second drain region DR2 may serve as a source electrode and a drain electrode, respectively.

The third gate insulation layer GI3 may cover the second active pattern AP2, and may be located on the first interlayer insulation layer ILD1. The third gate insulation layer GI3 may include an insulating material. The third gate insulation layer GI3 may include silicon oxide, silicon nitride, and/or silicon oxynitride, and may have a single layer or multilayer structure.

Referring to FIGS. 3, 4, 5, 6, 7, 8, and 11, the third gate layer GT3 may be located on the third gate insulation layer GI3. The third gate layer GT3 may include an upper initialization gate line GT3*a* and an upper compensation gate line GT3*b* (e.g., a first gate line).

The upper initialization gate line GT3*a* may extend in the first direction DR1. The upper initialization gate line GT3*a* may overlap (e.g., at least partially) the lower initialization gate line GT2*b* and the second active pattern AP2. The upper initialization gate line GT3*a* may be electrically connected to the lower initialization gate line GT2*b*. For example, the upper initialization gate line GT3*a* may contact with the lower initialization gate line GT2*b* through a contact. The upper initialization gate line GT3*a*, the second active pattern AP2, and the lower initialization gate line GT2*b* may compose the fourth transistor T4. For example, the lower initialization gate line GT2*b* may correspond to the back-gate terminal of the fourth transistor T4 described with reference to FIG. 3, and the upper initialization gate line GT3*a* may correspond to the gate terminal of the fourth transistor T4 described with reference to FIG. 3.

The upper compensation gate line GT3*b* may extend in the first direction DR1. The upper compensation gate line GT3*b* may overlap (e.g., at least partially) the lower compensation gate line GT2*c* and the second active pattern AP2. The upper compensation gate line GT3*b* may be electrically connected to the lower compensation gate line GT2c. For example, the upper compensation gate line GT3b may contact with the lower compensation gate line GT2c through a contact. The upper compensation gate line GT3b may receive the compensation control signal GC. The lower compensation gate line GT2c, the second active pattern AP2, and the upper compensation gate line GT3b may compose the third transistor T3. For example, the lower compensation gate line GT2c may correspond to the back-gate terminal of the third transistor T3 described with reference to FIG. 3, and the upper compensation gate line GT3b may correspond to the gate terminal of the third transistor T3 described with reference to FIG. 3.

For example, the third gate layer GT3 may include a metal, a metal alloy, a metal nitride, a conductive metal oxide, etc. For example, the third gate layer GT3 may include the same material as the first gate layer GT1 or the second gate layer GT2.

The second interlayer insulation layer ILD2 may cover the third gate layer GT3 and may be located on the third gate insulation layer GI3. The second interlayer insulation layer ILD2 may include an insulating material. For example, the second interlayer insulation layer ILD2 may include silicon oxide, silicon nitride, silicon oxynitride, aluminum oxide, etc.

Referring FIGS. 3, 4, 5, 6, 7, 8, 9, and 11, a first conductive layer SD1 may be located on the second interlayer insulation layer ILD2. The first conductive layer SD1 may include an initialization voltage connection electrode SD1a, a first transmission pattern SD1b, an anode initialization voltage line SD1c, a second transmission pattern SD1d, a third transmission pattern SD1e, a fourth transmission pattern SD1f, and a fifth transmission pattern SD1g.

The first transmission pattern SD1b may contact with the first active pattern AP1. The data voltage DATA may be transmitted to the first active pattern AP1 through the first transmission pattern SD1b.

The anode initialization voltage line SD1c may extend in the first direction DR1. The anode initialization voltage line SD1c may receive the anode initialization voltage AINT. The anode initialization voltage line SD1c may contact with the first active pattern AP1, and may transmit the anode initialization voltage AINT to the first active pattern AP1.

The second transmission pattern SD1d may contact with the second active pattern AP2 and the gate electrode GT1b. For example, the second transmission pattern SD1d may connect the gate electrode of the first transistor T1, the second electrode of the third transistor T3, and the second electrode of the fourth transistor T4.

The third transmission pattern SD1e may contact with the second active pattern AP2 and the first active pattern AP1. The third transmission pattern SD1e may electrically connect the second active pattern AP2 and the first active pattern AP1 to each other.

The fourth transmission pattern SD1f may extend in the first direction DR1. The fourth transmission pattern SD1f may receive the high power voltage ELVDD. The fourth transmission pattern SD1f may contact the first active pattern AP1, and may transmit the high power voltage ELVDD to the first active pattern AP1.

The fifth transmission pattern SD1g may contact the first active pattern AP1. The fifth transmission pattern SD1g may transmit the driving current or the anode initialization voltage AINT from the first active pattern AP1 to the light emitting diode LD.

The initialization voltage connection electrode SD1a may be spaced apart from the fifth transmission pattern SD1g.

The initialization voltage connection electrode SD1a may be connected to the voltage line GT2a and the second active pattern AP2 through contacts, respectively. For example, the initialization voltage connection electrode SD1a may be connected to the first electrode of the fourth transistor T4.

A first via insulation layer (e.g., the first via insulation layer VIA of FIG. 15) may cover the first conductive layer SD1 and may be located on the second interlayer insulation layer ILD2. The first via insulation layer may include an organic insulating material. For example, the first via insulation layer may include a photoresist, a polyacrylic resin, a polyimide-based resin, an acrylic resin, etc.

Referring to FIGS. 3 to 10, a second conductive layer SD2 may be located on the first via insulation layer. The second conductive layer SD2 may include a data line SD2a, a high power voltage line SD2b, and a sixth transmission pattern SD2c.

The data line SD2a may extend in the second direction DR2. The data voltage DATA may be transmitted to the first active pattern AP1 through the data line SD2a and the first transmission pattern SD1b.

The high power voltage line SD2b may be spaced apart from the data line SD2a and may extend in the second direction DR2. The high power voltage line SD2b may be connected to the fourth transmission pattern SD1f through a contact. Accordingly, the high power voltage line SD2b may be connected to the first electrode of the fifth transistor T5 and the first electrode of the storage capacitor CST by the fourth transmission pattern SD1f.

The sixth transmission pattern SD2c may contact the fifth transmission pattern SD1g. The sixth transmission pattern SD2c may transmit the driving current or the anode initialization voltage AINT from the fifth transmission pattern SD1g to the light emitting diode LD.

The second via insulation layer may cover the second conductive layer SD2 and may be located on the first via insulation layer. The second via insulation layer may include an organic insulating material.

Meanwhile, it should be noted that the layout structures shown in FIGS. 4 to 10 are merely an example, and may be variously changed in other embodiments.

Referring to FIG. 11, the first channel region CH1 of the first active pattern AP1 may overlap the gate electrode GT1b of the first gate layer GT1. The first active pattern AP1 may compose a first transistor T1 that is a driving transistor with the gate electrode GT1b.

The first active pattern AP1 may further include a third channel region CH3. The third channel region CH3 of the first active pattern AP1 may overlap the emission control line GT1c of the first gate layer GT1. The first active pattern AP1 may compose the fifth transistor T5 with the emission control line GT1c.

The gate electrode GT1b of the first gate layer GT1 may overlap the first storage capacitor electrode GT2d of the second gate layer GT2. The gate electrode GT1b may compose the storage capacitor CST with the first storage capacitor electrode GT2d.

The second active pattern AP2 may be located on the second gate layer GT2, and a third gate layer GT3 may be located on the second active pattern AP2.

The lower compensation gate line GT2c spaced apart from the first storage capacitor electrode GT2d and the second channel region CH2 of the second active pattern AP2 may overlap. Also, the second channel region CH2 of the second active pattern AP2 and the upper compensation gate line GT3b of the third gate layer GT3 may overlap. The second active pattern AP2 may compose the third transistor T3 that is a compensation transistor with the lower compensation gate line GT2c and the upper compensation gate line GT3b.

Figure 6:
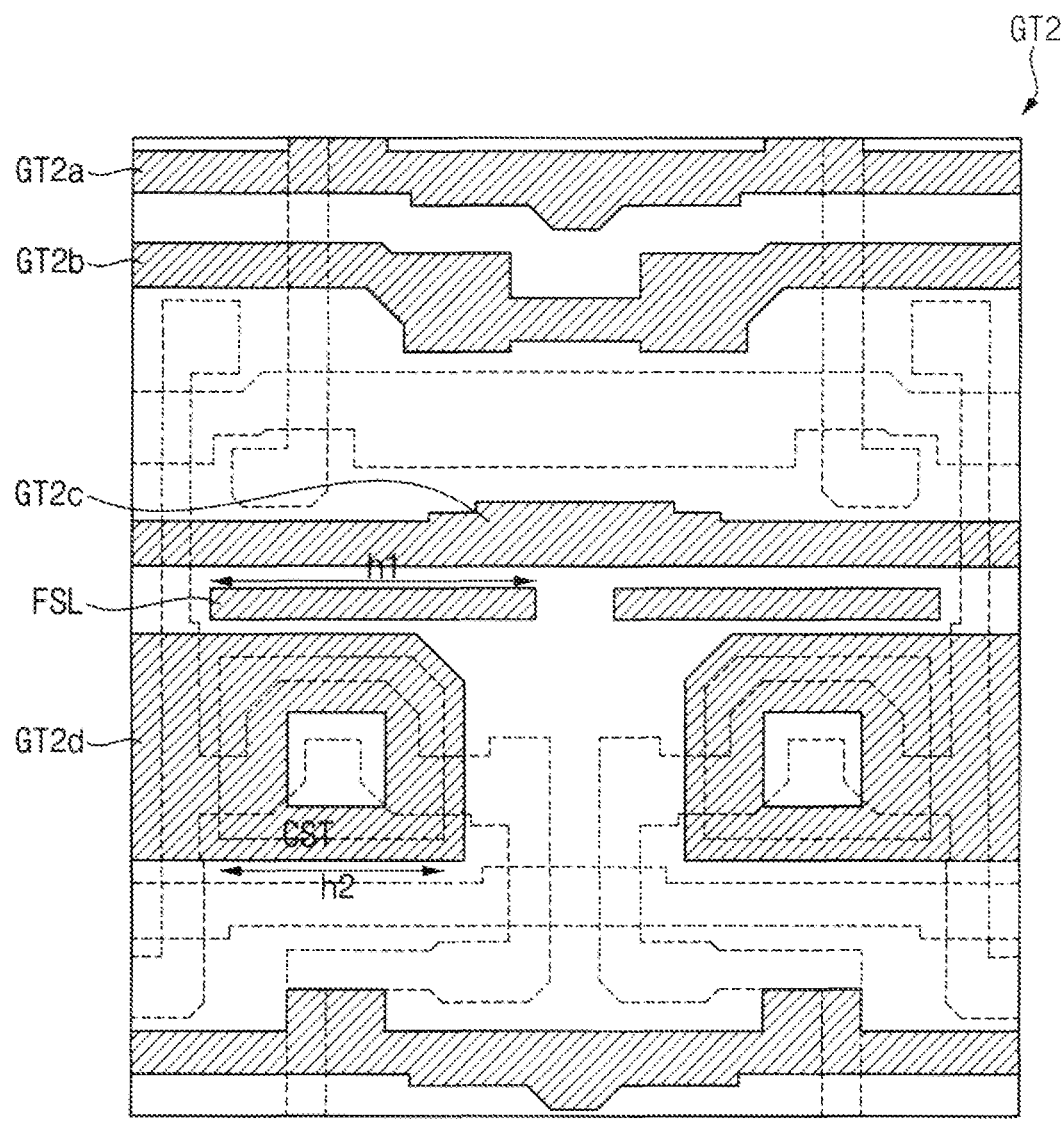
Figure 7:
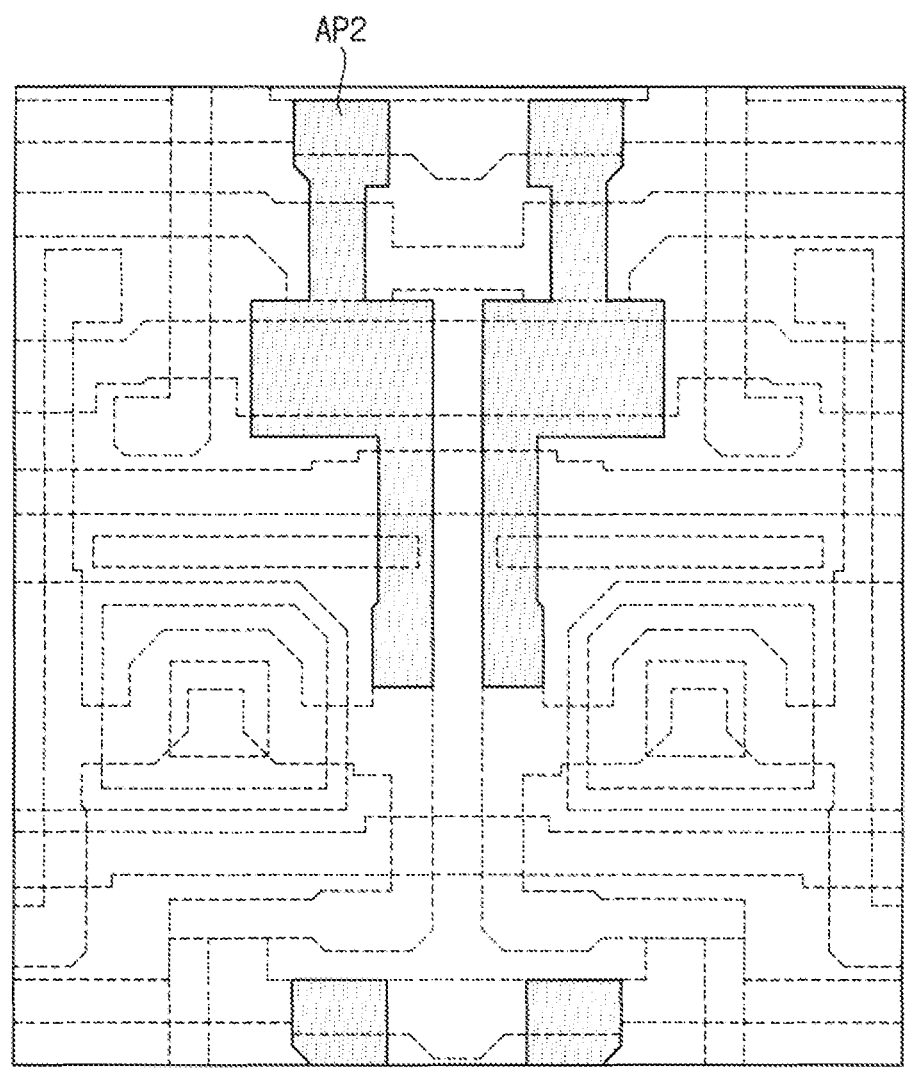
Figure 8:
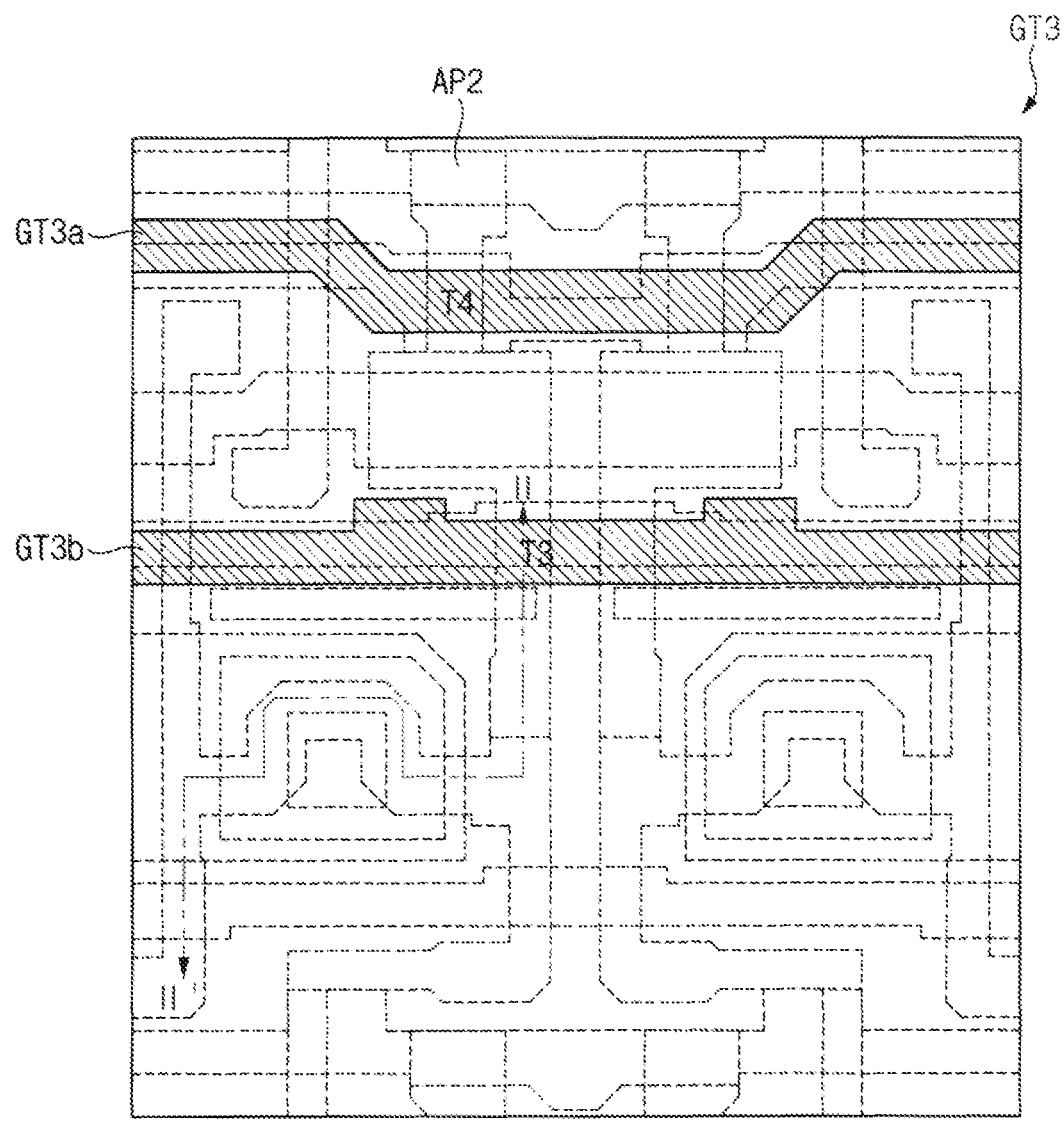
Figure 9:
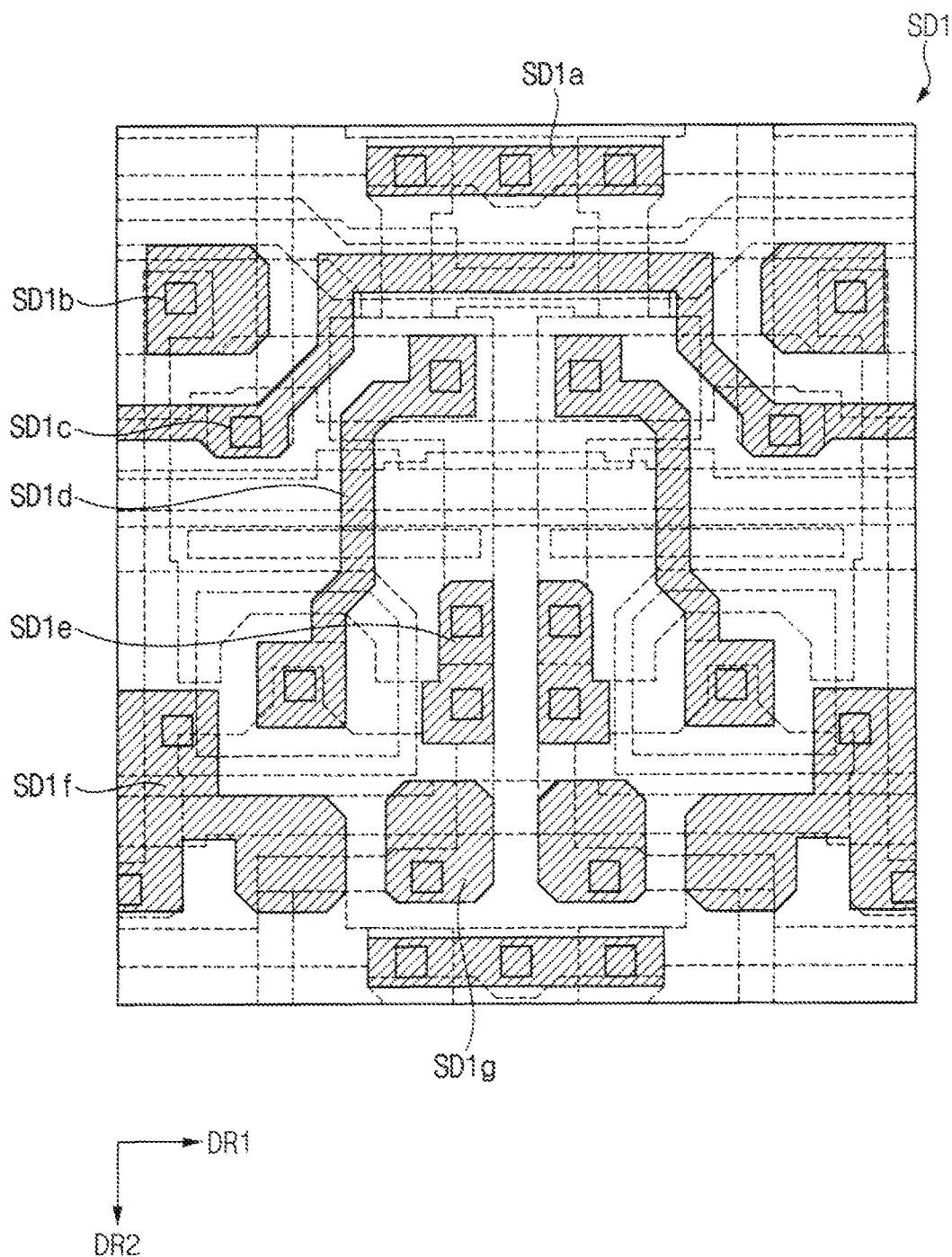
Figure 10:
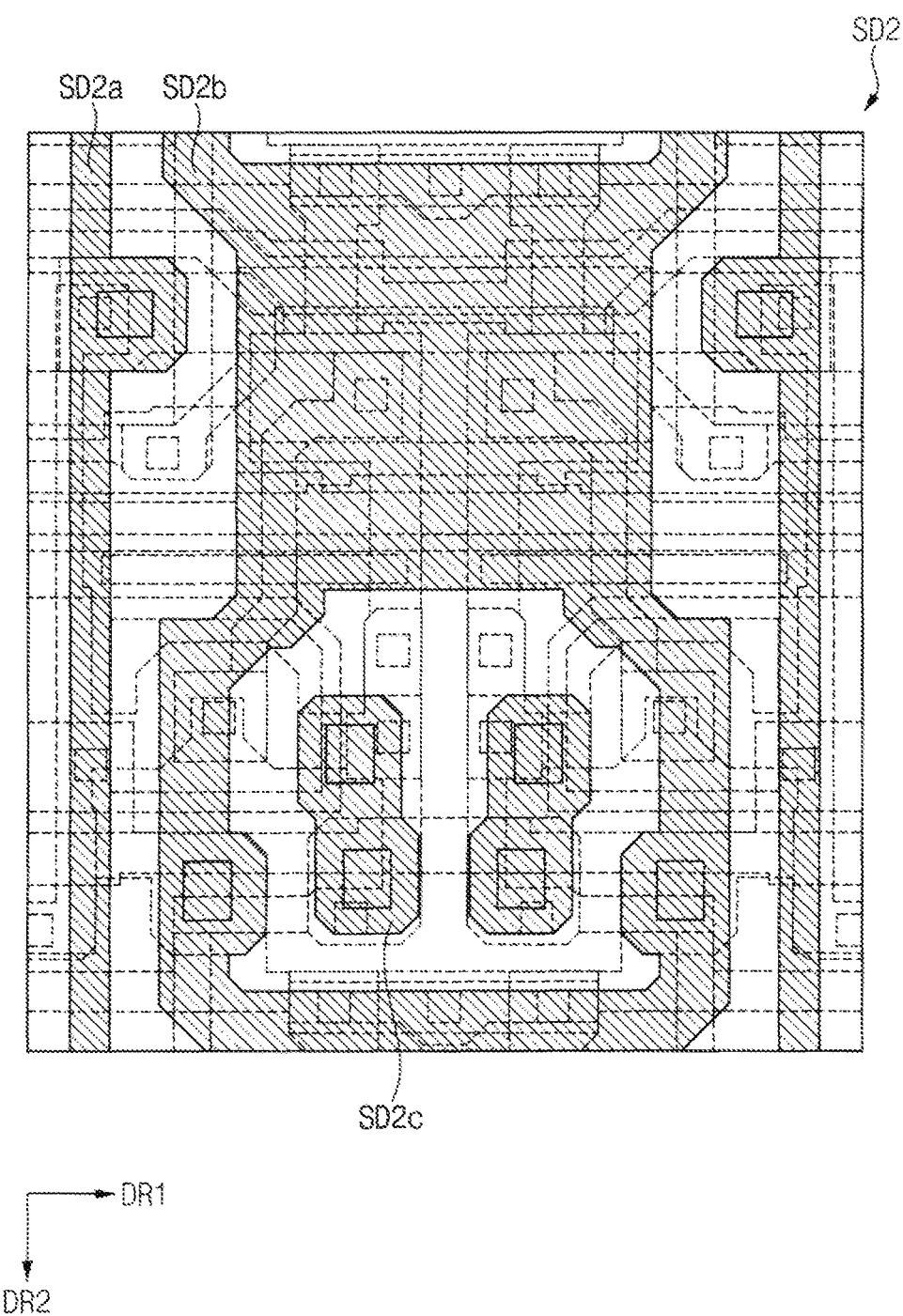

Referring to FIGS. 6, 8, and 11, the blocking pattern FSL may be located on a layer that is identical to that of the lower compensation gate line GT2c and the first storage capacitor electrode GT2d, and may be spaced apart from the lower compensation gate line GT2c and the first storage capacitor electrode. Also, the blocking pattern FSL may be located between the lower compensation gate line GT2c and the first storage capacitor electrode GT2d in a plan view.

In some embodiments, the upper compensation gate line GT3b located on the second channel region CH2 may receive the compensation control signal GC. The emission control line GT1c located on the third channel region CH3 may receive the emission control signal EM. The compensation control signal GC and the emission control signal EM may generate an electric field inside the display device 10.

The blocking pattern FSL might not overlap the second channel region CH2. The second channel region CH2 may overlap only the lower compensation gate line GT2c and the upper compensation gate line GT3b, and might not overlap the blocking pattern FSL. Accordingly, the blocking pattern FSL may block the electric field generated by the compensation control signal GC without affecting the third transistor T3.

A length h1 of the blocking pattern FSL in the first direction DR1 may be greater than a width of the blocking pattern FSL in the second direction DR2. That is, the blocking pattern FSL may have an elongated shape in the first direction DR1. The shape of the blocking pattern FSL may be one of shapes such as a rectangle shape and an oval shape. The length h1 of the blocking pattern FSL in the first direction DR1 may be greater than a length h2 of the first channel region CH1 in the first direction DR1. When the length h1 of the blocking pattern FSL in the first direction DR1 is less than the length h2 of the first channel region CH1 in the first direction DR1, only a portion of the electric field generated in a direction from the upper compensation gate line GT3b to the first transistor T1 may be blocked. When the length h1 of the blocking pattern FSL in the first direction DR1 is greater than the length h2 of the first channel region CH1 in the first direction DR1, a significant amount of the electric field may be blocked by the blocking pattern FSL.

In the conventional display device, charges may be formed under the first active pattern by the dipole polarization of the polymer film, the compensation control signal, and the emission control signal.

For example, light may enter through an opening of the cover panel of the display device. Electrons and holes may be generated in the polymer film due to the light. An electric field may be generated in the polymer film by the electrons and holes generated in the polymer film, the compensation control signal, and the emission control signal. The electric field may generate dipole polarization of the polymer film. When dipole polarization generates in the polymer film, charges may be formed under the first active pattern defining the first transistor. A characteristic of the first transistor may be changed due to the charge, and thus, a luminance of the display device may be changed, so that a light stain phenomenon may occur in the display device.

In some embodiments according to the present disclosure, the blocking pattern FSL may be located between the first channel region CH1 and the upper compensation gate line GT3b in a plan view. The blocking pattern FSL may block an electric field generated by the compensation control signal GC applied to the upper compensation gate line GT3b. Accordingly, even if the electric field generated by the emission control line GT1c remains, charges might not be concentrated in the lower portion of the first transistor T1. By blocking the electric field, the characteristic of the first transistor T1 might not change. Accordingly, the light stain phenomenon of the display device 10 may be improved and the display quality of the display device 10 may be improved.

Also, the blocking pattern FSL may be formed concurrently or substantially simultaneously with the second gate layer GT2 that includes the first storage capacitor electrode GT2d. Accordingly, a mask process for forming the blocking pattern FSL might not be added, and the manufacturing cost and manufacturing time of the display device 10 may be relatively reduced.

Figure 12:
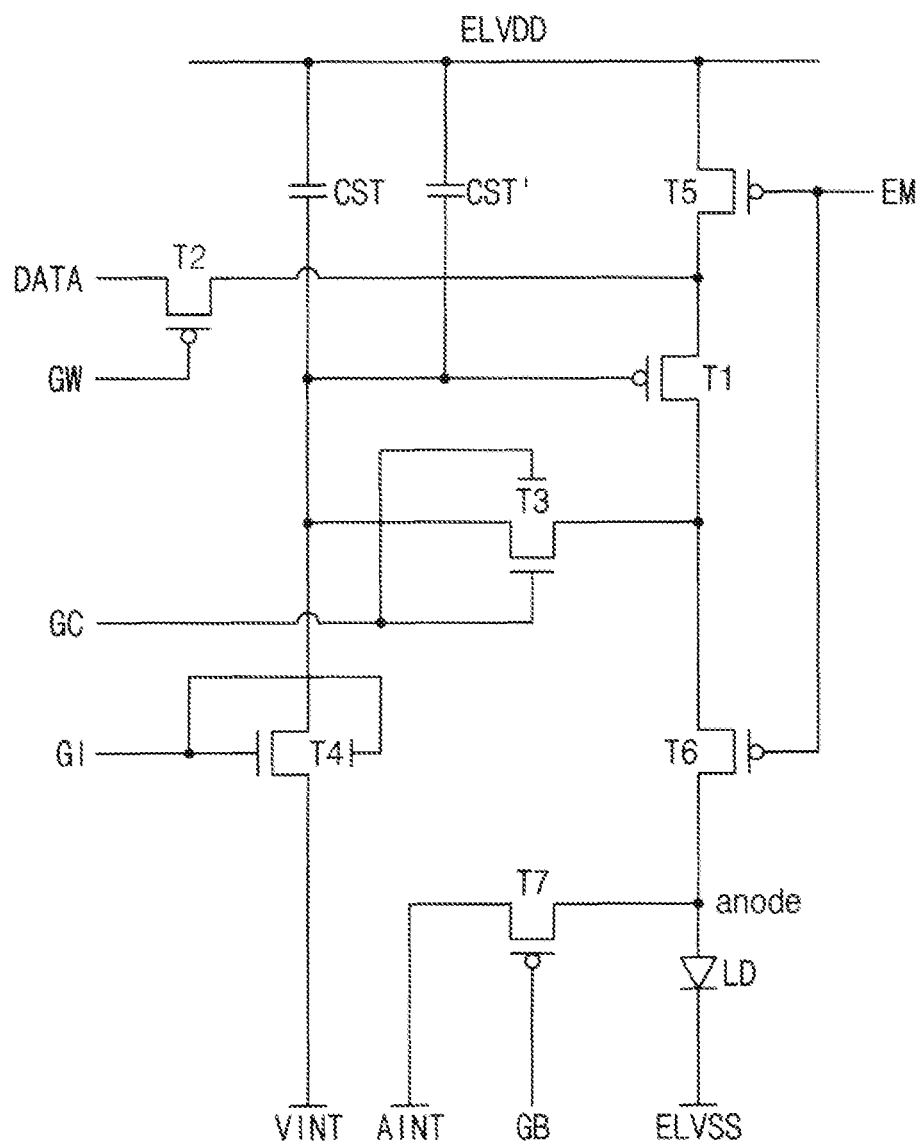
FIG. 12 is a circuit diagram illustrating another example of one pixel included in the display device of FIG. 1.
Figure 13:
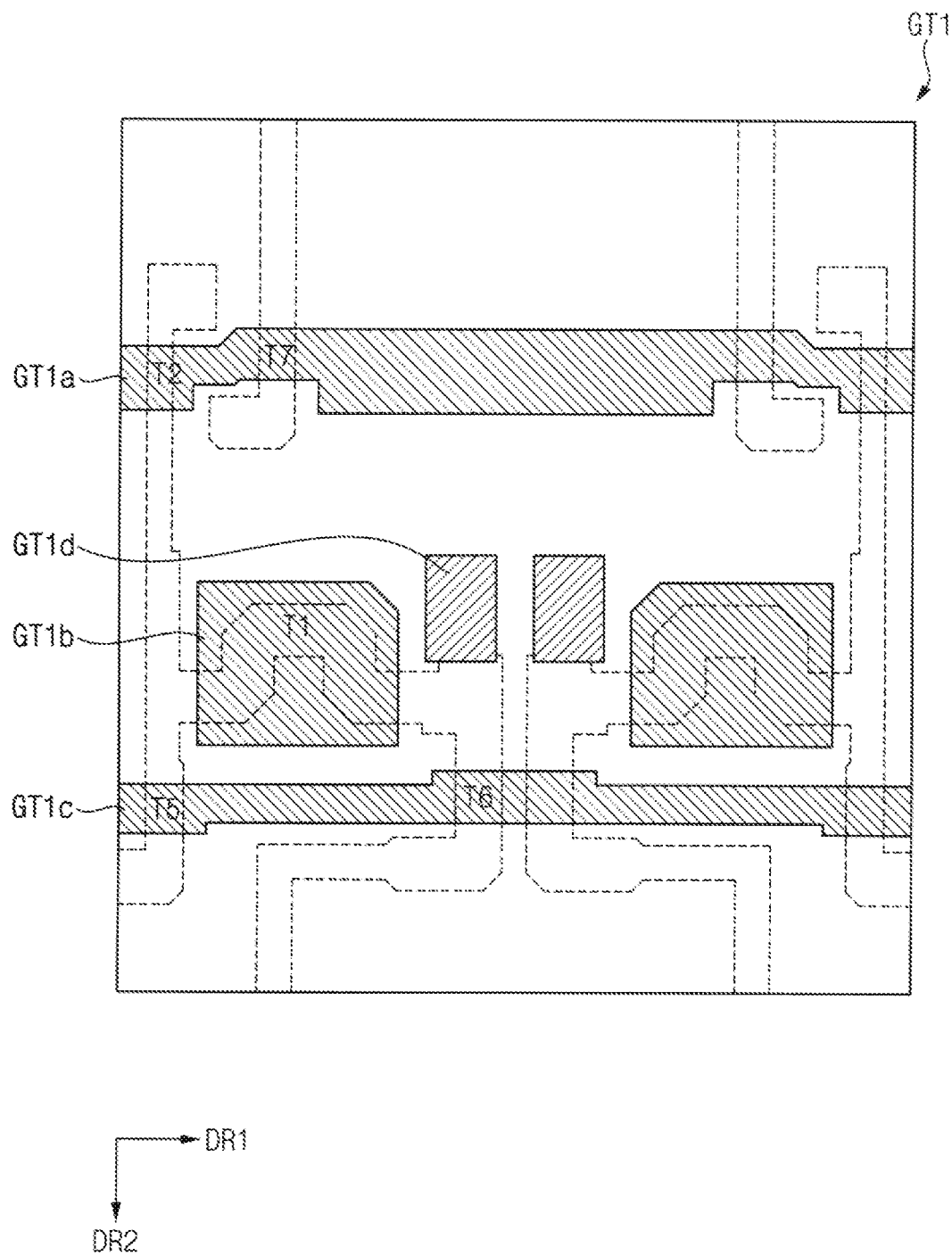
FIGS. 13 and 14 are layout views for explaining pixels included in a display device according to other embodiments.
Figure 14:
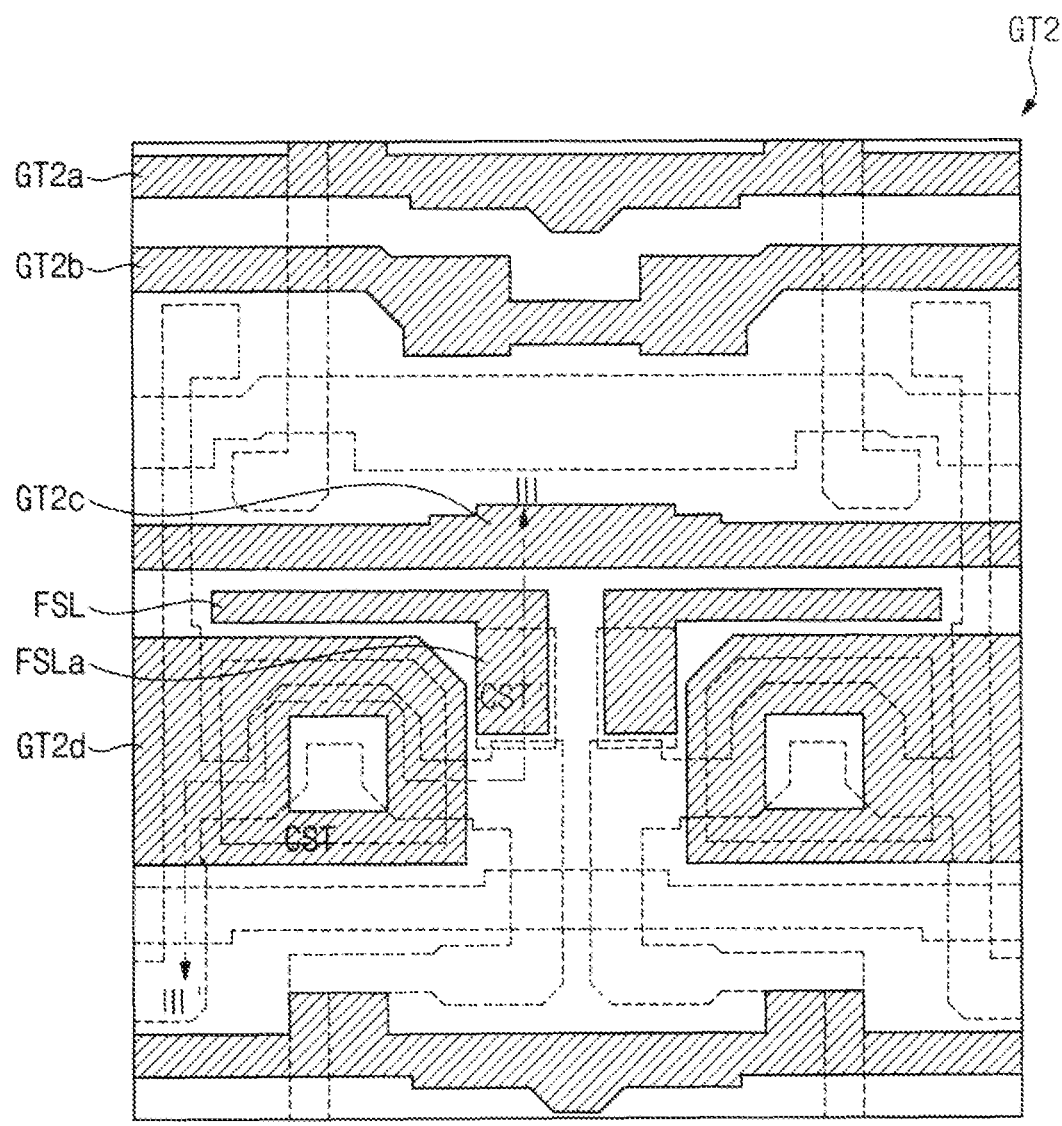
Figure 15:
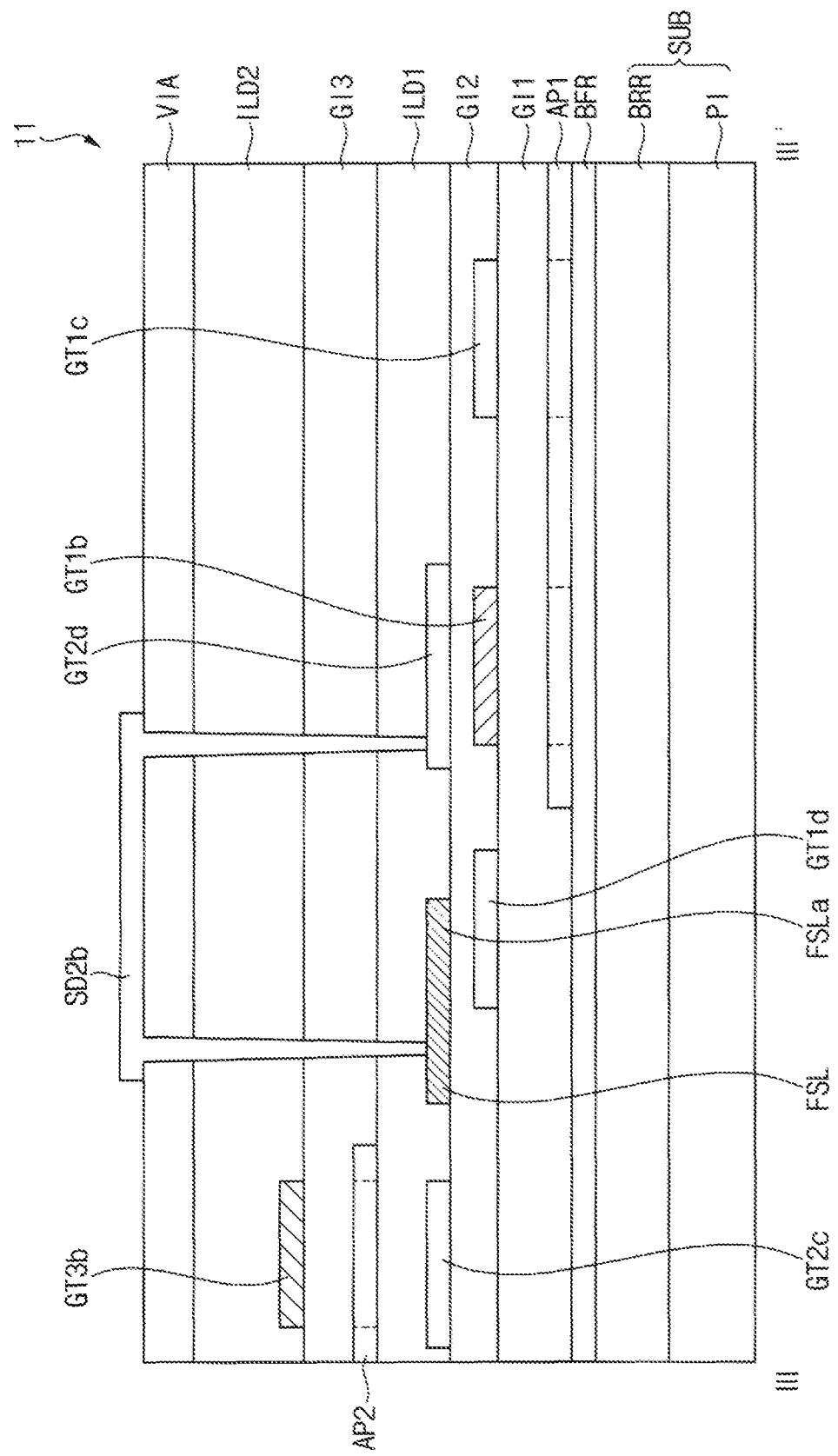
FIG. 15 is a cross-sectional view of the display device taken along the line III-Ill' of FIG. 14.

FIG. 12 is a circuit diagram illustrating another example of one pixel included in the display device of FIG. 1. FIGS. 13 and 14 are layout views for explaining pixels included in a display device according to other embodiments. FIG. 15 is a cross-sectional view of the display device taken along the line III-Ill' of FIG. 14.

In a display device 11 described with reference to FIGS. 12 to 15, components that are the same as those of the display device 10 that have been described above with reference to FIGS. 1 to 11 might not be described again below.

Referring to FIGS. 12 to 15, in some embodiments, the first gate layer GT1 of the display device 11 may further include a second storage capacitor electrode GT1d of a second storage capacitor CST' and spaced apart from the gate electrode GT1b. The second storage capacitor electrode GT1d may be located on the layer identical to the gate electrode GT1b, and may be spaced apart from the gate electrode GT1b in the first direction DR1.

Unlike the blocking pattern FSL of FIG. 6, the blocking pattern FSL of FIG. 14 may further include a protrusion FSLa protruding in the second direction DR2.

The blocking pattern FSL may overlap the second storage capacitor electrode GT1d. In detail, the protrusion FSLa of the blocking pattern FSL may overlap the second storage capacitor electrode GT1d.

In some embodiments, the high power voltage line SD2b may be directly connected to the blocking pattern through a contact. Also, the high power voltage line SD2b may be directly connected to the first storage capacitor electrode GT2d through a contact. However, embodiments according to the present disclosure are not limited thereto, and the high power voltage line SD2b may be connected to the blocking pattern FSL through a separate connection pattern. Similarly, the high power voltage line SD2b may be connected to the first storage capacitor electrode GT2d through a separate connection pattern.

The gate electrode GT1b and the first storage capacitor electrode GT2d may compose a first storage capacitor. The second storage capacitor electrode GT1d and the blocking pattern FSL may compose a second storage capacitor. Because the first storage capacitor CST and the second storage capacitor CST' are located in parallel, a capacity of the storage capacitor of the display device 11 may increase. When the capacity of the storage capacitor of the display device 11 increases, a kickback voltage may decrease. When the kickback voltage decreases, power consumption of the display device 11 may be reduced.

Figure 16:
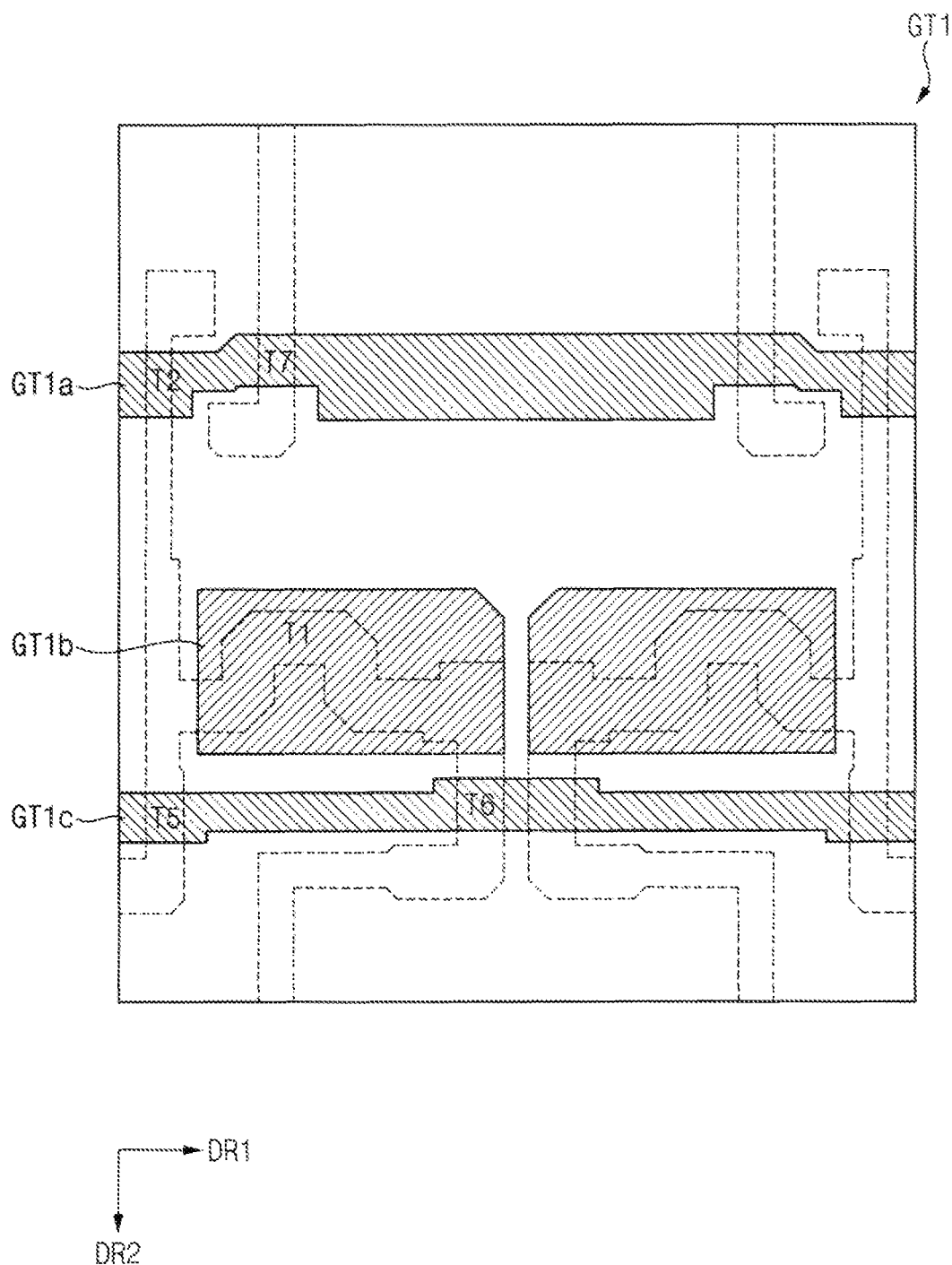
FIGS. 16 and 17 are layout views for explaining pixels included in a display device according to other embodiments.
Figure 17:
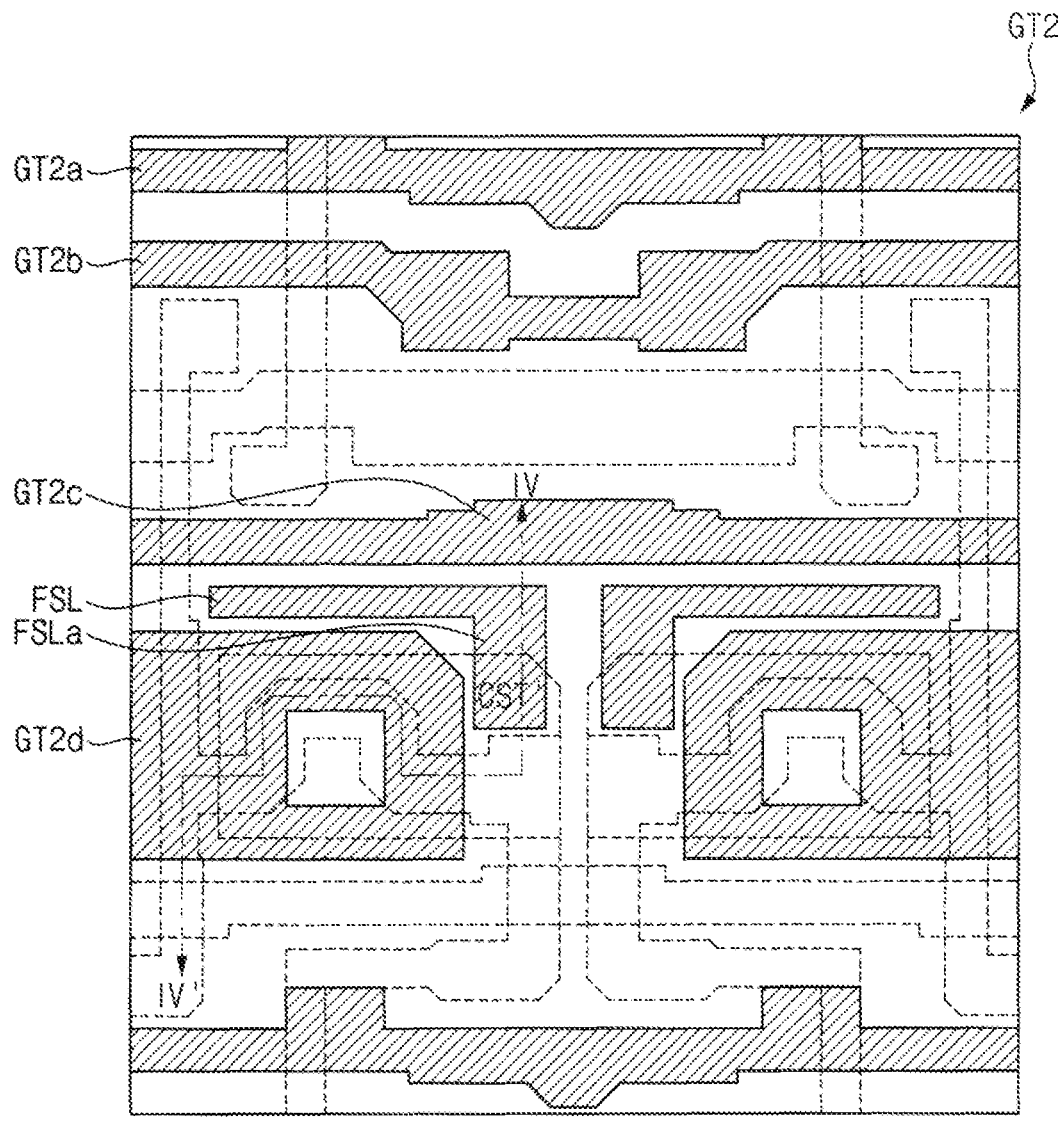
Figure 18:
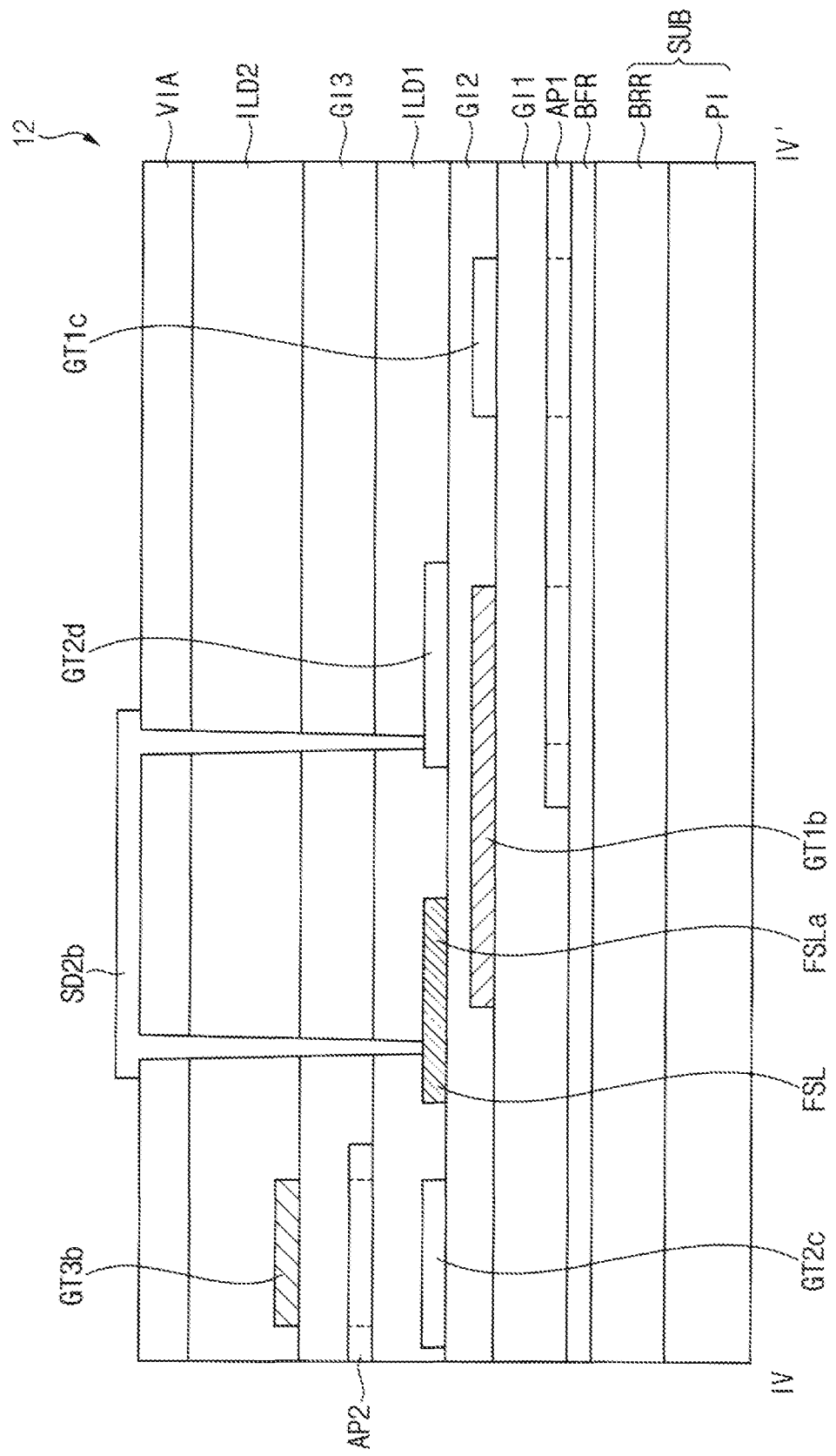
FIG. 18 is a cross-sectional view of the display device taken along the line IV-IV' of FIG. 17.

FIGS. 16 and 17 are layout views for explaining pixels included in a display device according to other embodiments. FIG. 18 is a cross-sectional view of the display device taken along the line IV-IV' of FIG. 17.

In a display device 12 described with reference to FIGS. 16 to 18, components that are the same as those of the display device 10 that have been described above with reference to FIGS. 1 to 11 might not be described again below.

Referring to FIGS. 12, 16, 17, and 18, in some embodiments, the blocking pattern FSL may overlap the gate electrode GT1b. For example, the gate electrode GT1b of FIG. 16 may be larger in the first direction DR1 than the gate electrode GT1b of FIG. 5. Also, a shape of the gate electrode GT1b of FIG. 16 may be a shape in which the gate electrode GT1b of FIG. 13 and the second storage capacitor electrode GT1d are connected. Accordingly, the gate electrode GT1b and the protrusion FSLa of the blocking pattern FSL may overlap each other.

In some embodiments, the high power voltage line SD2b may be directly connected to the blocking pattern through a contact. The high power voltage line SD2b may be directly connected to the first storage capacitor electrode GT2d through a contact. However, embodiments according to the present disclosure are not limited thereto, and the high power voltage line SD2b may be connected to the blocking pattern FSL through a separate connection pattern. Similarly, the high power voltage line SD2b may be connected to the first storage capacitor electrode GT2d through a separate connection pattern.

The gate electrode GT1b and the first storage capacitor electrode GT2d may compose a first storage capacitor. The gate electrode GT1b and the protrusion FSLa of the blocking pattern FSL may compose the second storage capacitor CST'. Because the first storage capacitor CST and the second storage capacitor CST' are located in parallel, the capacity of the storage capacitor may increase. When the capacity of the storage capacitor of the display device 12 increases, the kickback voltage may decrease. When the kickback voltage is decreased, the power consumption of the display device 12 may be reduced.

The display devices according to the embodiments may be applied to a display device included in a computer, a notebook, a mobile phone, a smartphone, a smart pad, a portable media player (PMP), a personal digital assistant (PDA), an MP3 player, or the like.

Although the display devices according to some embodiments have been described with reference to the drawings, the illustrated embodiments are only examples, and may be modified and changed by a person having ordinary knowledge in the relevant technical field without departing from the technical spirit described in the following claims, with functional equivalents thereof to be included therein.

What is claimed is:

1. A display device comprising:
    a substrate comprising a polymer film;
    a first active pattern above the substrate, and comprising a first channel region;
    a gate electrode above the first active pattern, and overlapping the first channel region;
    a first storage capacitor electrode above the gate electrode, and overlapping the gate electrode, the first storage capacitor electrode and the gate electrode comprising a storage capacitor;
    a second active pattern at a layer above the first storage capacitor electrode, and comprising a second channel region;
    a first gate line above the second active pattern, overlapping the second channel region, and spaced apart from the first channel region in a plan view; and
    a blocking pattern between the first channel region and the first gate line in the plan view.

2. The display device of claim 1, wherein the blocking pattern does not overlap the second channel region.

3. The display device of claim 1, wherein the blocking pattern is at a same layer as the first storage capacitor electrode, and is spaced apart from the first storage capacitor electrode in a plan view.

4. The display device of claim 1, wherein a length of the blocking pattern in a first direction is greater than a length of the first channel region in the first direction.

5. The display device of claim 1, further comprising a second gate line at a same layer as the first storage capacitor electrode, overlapping the first gate line, and spaced apart from the blocking pattern in a plan view.

6. The display device of claim 5, wherein the blocking pattern is between the second gate line and the first storage capacitor electrode in a plan view.

7. The display device of claim 1, wherein the polymer film comprises a polyimide.

8. The display device of claim 1, further comprising a cover panel under the substrate and defining at least one opening,
    wherein the substrate comprises a sensing area, and a display area surrounding the sensing area, and
    wherein the blocking pattern is in the sensing area.

9. The display device of claim 1, wherein the blocking pattern overlaps the gate electrode.

10. The display device of claim 9, wherein the gate electrode and the first storage capacitor electrode compose a first storage capacitor, and
    wherein the gate electrode and the blocking pattern compose a second storage capacitor.

11. The display device of claim 9, further comprising a high power voltage line above the first gate line, connected to the blocking pattern, and connected to the first storage capacitor electrode.

12. The display device of claim 1, further comprising a second storage capacitor electrode at a same layer as the gate electrode, and spaced apart from the gate electrode in a plan view.

13. The display device of claim 12, wherein the blocking pattern overlaps the second storage capacitor electrode.

14. The display device of claim 13,
    wherein the second storage capacitor electrode and the blocking pattern compose a second storage capacitor.

15. A display device comprising:
    a substrate comprising a polymer film;
    a first active pattern above the substrate, and comprising a first channel region;
    a gate electrode above the first active pattern, overlapping the first channel region, and composing a driving transistor with the first active pattern;
    a first storage capacitor electrode above the gate electrode, and overlapping the gate electrode, the first storage capacitor electrode and the gate electrode comprising a storage capacitor;
    a second active pattern at a layer above the first storage capacitor electrode, and comprising a second channel region;
    a first gate line above the second active pattern, overlapping the second channel region, and composing a compensation transistor with the second active pattern; and a blocking pattern having a bottom surface being coplanar with a bottom surface of the first storage capacitor electrode, the blocking pattern being between the driving transistor and the compensation transistor in a plan view.

16. The display device of claim 15, wherein the blocking pattern is at a same layer as the first storage capacitor electrode, and is spaced apart from the first storage capacitor electrode in a plain view.

17. The display device of claim 15, wherein the blocking pattern overlaps the gate electrode.

18. The display device of claim 15, further comprising a second storage capacitor electrode at a same layer as the gate electrode, and spaced apart from the gate electrode.

19. The display device of claim 18, wherein the blocking pattern overlaps the second storage capacitor electrode.

* * * * *